United States Patent
Seo et al.

(10) Patent No.: US 12,382,722 B2
(45) Date of Patent: Aug. 5, 2025

(54) DISPLAY DEVICE

(71) Applicant: LG Display Co., Ltd., Seoul (KR)

(72) Inventors: Daeyoung Seo, Seoul (KR); Hun Jang, Paju-si (KR); Hyungon Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/240,039

(22) Filed: Aug. 30, 2023

(65) Prior Publication Data

US 2024/0079414 A1   Mar. 7, 2024

(30) Foreign Application Priority Data

Sep. 5, 2022 (KR) ..................... 10-2022-0111928

(51) Int. Cl.
| | |
|---|---|
| *H10D 86/60* | (2025.01) |
| *G06F 3/041* | (2006.01) |
| *G06F 3/044* | (2006.01) |
| *G09G 3/32* | (2016.01) |
| *H01L 25/16* | (2023.01) |
| *H10D 86/40* | (2025.01) |

(52) U.S. Cl.
CPC ........... *H10D 86/60* (2025.01); *G06F 3/0412* (2013.01); *G06F 3/04166* (2019.05); *G06F 3/0446* (2019.05); *H01L 25/167* (2013.01); *H10D 86/441* (2025.01); *G09G 3/32* (2013.01); *G09G 2300/0426* (2013.01); *G09G 2300/0842* (2013.01); *G09G 2310/08* (2013.01); *G09G 2354/00* (2013.01)

(58) Field of Classification Search
None
See application file for complete search history.

(56) References Cited

U.S. PATENT DOCUMENTS

| | | | |
|---|---|---|---|
| 2005/0012736 A1* | 1/2005 | Uchino | G09G 3/3208 345/211 |
| 2008/0186417 A1* | 8/2008 | Jung | G02F 1/13338 349/12 |
| 2010/0188365 A1* | 7/2010 | Tamaki | G09G 3/3648 345/174 |
| 2011/0187669 A1* | 8/2011 | Abiru | G02F 1/13338 438/30 |

(Continued)

FOREIGN PATENT DOCUMENTS

| | | |
|---|---|---|
| JP | 2011-237489 A | 11/2011 |
| JP | 2018-54874 A | 4/2018 |

(Continued)

*Primary Examiner* — Dorothy Harris
(74) *Attorney, Agent, or Firm* — Birch, Stewart, Kolasch & Birch, LLP

(57) ABSTRACT

A display device according to an example includes a plurality of sub pixels disposed on a substrate, and a plurality of touch units disposed on the substrate. Each sub pixel can include a driving transistor, a light emitting diode, and a pixel electrode connecting the driving transistor and the light emitting diode. Each touch unit can include a touch sensing transistor and a touch electrode connected to the touch sensing transistor, where the pixel electrode and the touch electrode are disposed on the same layer. Accordingly, the pixel electrode and the touch electrode are disposed on the substrate to sense the touch by a self-capacitance manner.

10 Claims, 12 Drawing Sheets

(56) References Cited

U.S. PATENT DOCUMENTS

| | | | | |
|---|---|---|---|---|
| 2014/0168157 A1* | 6/2014 | Yang | ............... | G06F 3/0445 |
| | | | | 345/174 |
| 2015/0002421 A1* | 1/2015 | Kim | ............... | G06F 3/0416 |
| | | | | 345/173 |
| 2015/0205440 A1* | 7/2015 | Yang | ............... | G06F 3/0421 |
| | | | | 345/174 |
| 2015/0331508 A1* | 11/2015 | Nho | ............... | H10K 59/65 |
| | | | | 345/173 |
| 2015/0362773 A1* | 12/2015 | Mu | ............... | G02F 1/13338 |
| | | | | 349/12 |
| 2016/0291424 A1* | 10/2016 | Sun | ............... | G02F 1/134309 |
| 2016/0328037 A1* | 11/2016 | Zhuang | ............... | G06F 3/041 |
| 2016/0349559 A1* | 12/2016 | Woo | ............... | G06F 3/0412 |
| 2017/0269730 A1* | 9/2017 | Wang | ............... | G06F 3/04164 |
| 2018/0090544 A1* | 3/2018 | Gunji | ............... | H10K 59/123 |
| 2018/0188861 A1* | 7/2018 | Wu | ............... | H10D 86/60 |
| 2019/0278455 A1* | 9/2019 | Li | ............... | G09G 3/3225 |
| 2021/0005145 A1* | 1/2021 | Lee | ............... | G09G 3/3266 |
| 2021/0091159 A1 | 3/2021 | Lee et al. | | |

FOREIGN PATENT DOCUMENTS

| | | |
|---|---|---|
| JP | 2020-126581 A | 8/2020 |
| KR | 10-2020-0111866 A | 10/2020 |
| KR | 10-2021-0026603 A | 3/2021 |
| KR | 10-2021-0085202 A | 7/2021 |

\* cited by examiner

DISPLAY DEVICE

CROSS-REFERENCE TO RELATED APPLICATIONS

This application claims priority to Korean Patent Application No. 10-2022-0111928 filed on Sep. 5, 2022 in the Korean Intellectual Property Office, the disclosure of which is hereby expressly incorporated by reference into the present application.

BACKGROUND

Field

The present disclosure relates to a display device, and more particularly, to a display device which is capable of performing touch sensing and uses a light emitting diode (LED).

Discussion of the Related Art

Among the display devices which are used in a monitor of a computer, a television, or a cellular phone, there are an organic light emitting display (OLED) device which is a self-emitting device and a liquid crystal display (LCD) device which requires a separate light source.

An applicable range of the display device can be diversified and expanded to personal digital assistants as well as monitors of computers and televisions. As a result, a display device with a large display area and a reduced volume and weight is being studied.

Further, in recent years, a display device including an LED is attracting attention as a next generation display device. Since the LED is formed of an inorganic material, rather than an organic material, reliability is excellent so that a lifespan thereof is longer than that of the liquid crystal display device or the organic light emitting display device.

Further, the LED has a fast lighting speed, excellent luminous efficiency, and a strong impact resistance so that its stability is excellent and an image having a high luminance can be displayed.

SUMMARY OF THE DISCLOSURE

An object to be achieved by the present disclosure is to provide a display device which is capable of performing improved touch sensing.

Another object to be achieved by the present disclosure is to provide a display device which uses an assembly line as a touch sensing line to simplify the structure of a touch unit.

Still another object to be achieved by the present disclosure is to provide a display device which uses any one of a plurality of wiring lines for driving a sub pixel as a touch sensing line to simplify the structure of a touch unit.

Still another object to be achieved by the present disclosure is to provide a display device which simultaneously drives a sub pixel and a touch unit.

Still another object to be achieved by the present disclosure is to provide a display device which time-divisionally drives a sub pixel and a touch unit.

Objects of the present disclosure are not limited to the above-mentioned objects, and other objects, which are not mentioned above, can be clearly understood by those skilled in the art from the following descriptions.

According to an aspect of the present disclosure, a display device includes a plurality of sub pixels which is disposed on a substrate and each includes a driving transistor, a light emitting diode, and a pixel electrode connecting the driving transistor and the light emitting diode; and a plurality of touch units which is disposed on the substrate and each includes a touch sensing transistor and a touch electrode connected to the touch sensing transistor, where the pixel electrode and the touch electrode are disposed on the same layer. Accordingly, the pixel electrode and the touch electrode are disposed on the substrate to sense the touch by a self-capacitance manner.

According to another aspect of the present disclosure, a display device includes a display panel in which a plurality of sub pixels and a plurality of touch units are disposed; and a touch driver which supplies a touch driving signal to the plurality of touch units, where the plurality of sub pixels and the plurality of touch units are disposed in different rows. Accordingly, a plurality of touch units is disposed in the display panel to sense the touch by an in-cell manner.

Other detailed matters of the exemplary embodiments are included in the detailed description and the drawings.

According to an aspect of the present disclosure, a touch unit is formed in a display panel to sense a touch input.

According to an aspect of the present disclosure, one of assembly lines for self-assembling a light emitting diode is used as a touch sensing line to simplify a structure of a touch unit.

According to an aspect of the present disclosure, one of wiring lines for driving a sub pixel is used as a touch sensing line to simplify a structure of a touch unit.

According to an aspect of the present disclosure, a sub pixel and a touch unit can be simultaneously driven.

According to an aspect of the present disclosure, a sub pixel and a touch unit can be time-divisionally driven.

The effects according to one or more embodiments of the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
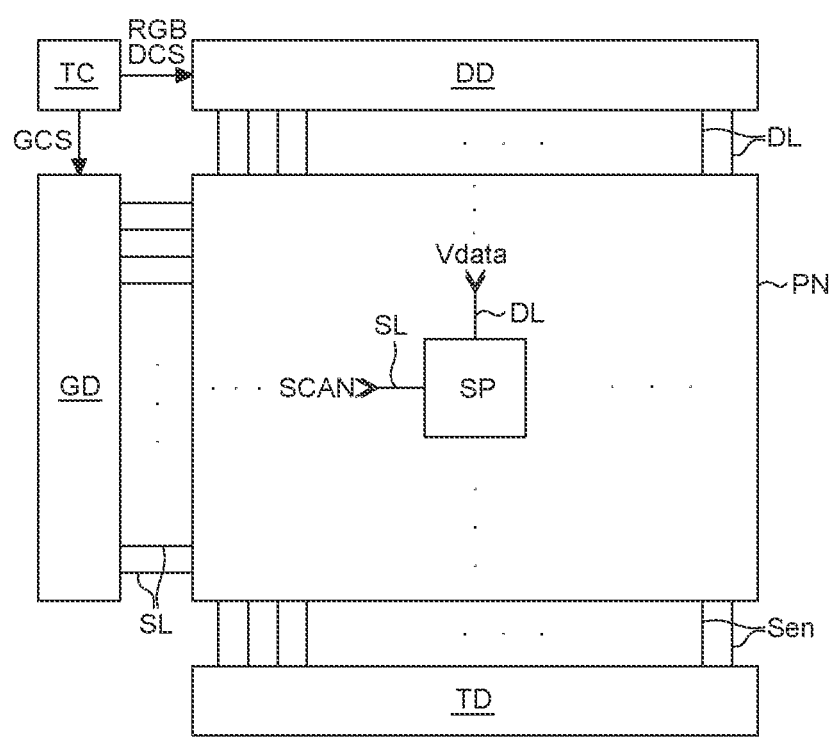
FIG. 1 is a schematic diagram of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "comprising," etc. used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components, and may not define order or sequence. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other. Further, the term "exemplary" can be interchangeably used with the term "example" and can have the same or similar meaning as "example".

Hereinafter, a display device according to exemplary embodiments of the present disclosure will be described in detail with reference to accompanying drawings. All the components of each display device according to all embodiments of the present disclosure are operatively coupled and configured.

FIG. 1 is a schematic diagram of a display device according to an exemplary embodiment of the present disclosure. In FIG. 1, for the convenience of description, among various components of a display device 100, a display panel PN, a gate driver GD, a data driver DD, a touch driver TD, and a timing controller TC are illustrated.

Referring to FIG. 1, the display device 100 includes a display panel PN including a plurality of sub pixels SP, a gate driver GD and a data driver DD which supply various signals to the display panel PN, a timing controller TC which controls the gate driver GD and the data driver DD, and a touch driver TD which senses a touch input.

The display panel PN is a configuration which displays images to the user and includes the plurality of sub pixels SP. In the display panel PN, a plurality of scan lines SL and a plurality of data lines DL intersect each other and the plurality of sub pixels SP is connected to the scan lines SL and the data lines DL, respectively. In addition, each of the plurality of sub pixels SP can be connected to a high potential power line, a low potential power line, a reference line, and the like.

The plurality of sub pixels SP is a minimum unit which configures a screen and each of the plurality of sub pixels SP can include a light emitting diode and a driving circuit for driving the light emitting diode. The plurality of light emitting diodes can be defined in different manners depending on the type of the display panel PN. For example, when the display panel PN is an inorganic light emitting display panel, the light emitting diode can be a light emitting diode (LED) or a micro light emitting diode (micro LED).

The gate driver GD supplies a plurality of scan signals SCAN to a plurality of scan lines SL in accordance with a plurality of gate control signals GCS supplied from the timing controller TC. Even though in FIG. 1, it is illustrated that one gate driver GD is disposed to be spaced apart from one side of the display panel PN, the number of the gate drivers GD and the placement thereof are not limited thereto.

The data driver DD converts image data RGB input from the timing controller TC in accordance with a plurality of data control signals DCS supplied from the timing controller TC into a data voltage using a reference gamma voltage. The data driver DD can supply the converted data voltage to the plurality of data lines DL.

The timing controller TC aligns image data RGB input from the outside to supply the image data to the data driver DD. The timing controller TC can generate a gate control signal GCS and a data control signal DCS using synchronization signals input from the outside, such as a dot clock signal, a data enable signal, and horizontal/vertical synchronization signals. The timing controller TC supplies the generated gate control signal GCS and data control signal DCS to the gate driver GD and the data driver DD, respectively, to control the gate driver GD and the data driver DD.

The touch driver TD drives a touch unit during a touch sensing period based on a touch enable signal input from the timing controller TC or an external configuration. The touch driver TD supplies the touch driving signal to a plurality of touch electrodes of the touch unit through a touch sensing line Sen during the touch sensing period to sense the touch input.

The touch unit is a configuration including a plurality of touch electrodes to detect the touch input. The touch unit is disposed in the display panel PN to detect the touch input on the display panel PN. The plurality of touch electrodes is connected to the touch sensing line Sen and the touch driver TD to sense the touch input. At this time, according to the placement method of the touch electrode, there are an add-on type in which a separate touch unit is manufactured to be attached onto the display panel PN, an on-cell type in which the touch unit is directly formed on the display panel PN, an in-cell type in which the touch unit is embedded in the display panel PN, and the like.

Further, the touch unit can sense the touch by a mutual-capacitance manner or a self-capacitance manner. For example, according to the mutual-capacitance manner, the touch unit is configured by a driving touch electrode applied with a touch driving signal and a sensing touch electrode which detects a touch sensing signal and forms a capacitance with the driving touch electrode. The touch can be sensed based on the capacitance variation between the driving touch electrode and the sensing touch electrode. According to the self-capacitance manner, the touch unit can be configured by a plurality of touch electrodes which serves as a driving touch electrode and a sensing touch electrode. Further, the touch driving signal is applied to the touch electrode and the touch input can be sensed based on the capacitance variation of the touch electrode according to the presence of the touch.

Hereinafter, it is described that the touch unit of the display device 100 according to the exemplary embodiment of the present disclosure is an in-cell type in which the touch electrode is embedded in the display panel PN and is a self-capacitance type in which one touch electrode measures the variation of the capacitance to sense the touch.

Hereinafter, the plurality of sub pixels SP and the touch unit TU of the display panel PN of the display device 100 according to an exemplary embodiment of the present disclosure will be described in more detail.

Figure 2:
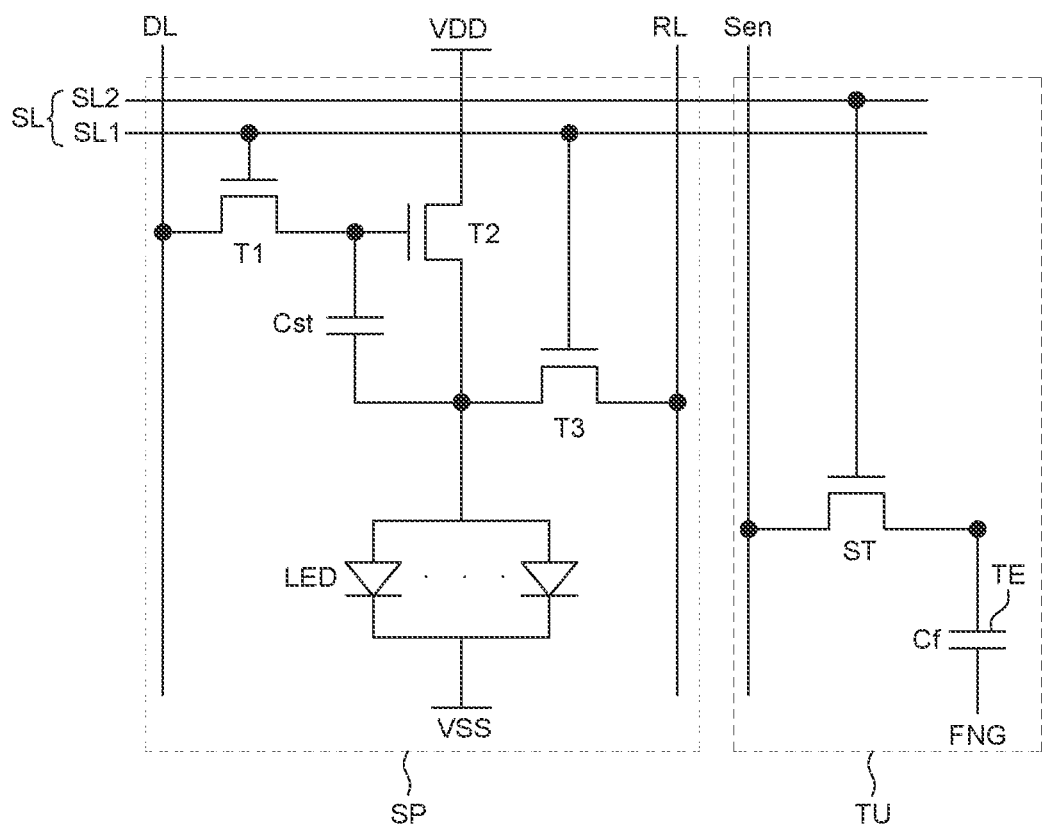
FIG. 2 is a circuit diagram of a sub pixel and a touch unit of a display device according to an exemplary embodiment of the present disclosure.

FIG. 2 is a circuit diagram of a sub pixel and a touch unit of a display device according to an exemplary embodiment of the present disclosure. The sub pixel and the touch unit of FIG. 2 can be used in the display device of FIG. 1 or any other display device of the present disclosure.

Referring to FIG. 2, each of the plurality of sub pixels SP includes a first transistor T1, a second transistor T2, a third transistor T3, a storage capacitor Cst, and one or more light emitting diodes LED. The touch unit TU includes a touch sensing transistor ST, a touch electrode TE, and a touch capacitor Cf.

Referring to FIG. 2, the first transistor T1, the second transistor T2, and the third transistor T3 of each of the plurality of sub pixels SP include a gate electrode, a source electrode, and a drain electrode. The first transistor T1, the second transistor T2, and the third transistor T3 can be P-type thin film transistors or N-type thin film transistors. For example, since in the P-type thin film transistor, holes move from the source electrode to the drain electrode, the current can flow from the source electrode to the drain electrode. Since in the N-type thin film transistor, electrons move from the source electrode to the drain electrode, the current can flow from the drain electrode to the source electrode. Hereinafter, the description will be made under the assumption that the first transistor T1, the second transistor T2, and the third transistor T3 are N-type thin film transistors in which the current flows from the drain electrode to the source electrode, but the present disclosure is not limited thereto.

The first transistor T1 is a transistor which transmits a data voltage to the gate electrode of the second transistor T2. The first transistor T1 includes a gate electrode connected to the first scan line SL1, a drain electrode connected to the data line DL, and a source electrode connected to the gate electrode of the second transistor T2. The first transistor T1 can be turned on by a signal from the first scan line SL1 and a data voltage from the data line DL can be transmitted to the gate electrode of the second transistor T2 through the turned-on first transistor T1. Accordingly, the first transistor T1 can be referred to as a switching transistor.

The second transistor T2 is a transistor which supplies a driving current to the light emitting diode LED. The second transistor T2 includes a gate electrode connected to the first transistor T1, a drain electrode connected to the high potential power line VDD, and a source electrode connected to the light emitting diode LED. The second transistor T2 is turned on to control the current flowing to the light emitting diode LED. Accordingly, the second transistor T2 which controls the driving current can be referred to as a driving transistor.

The third transistor T3 is a transistor for compensating for a threshold voltage of the second transistor T2. The third transistor T3 is connected between a source electrode of the second transistor T2 and the reference line RL. The third transistor T3 includes a gate electrode connected to the first scan line SL1, a source electrode and a drain electrode which are connected to the source electrode of the second transistor T2 and the reference line RL, respectively. Any one of the source electrode and the drain electrode of the third transistor T3 is connected to a node between the second transistor T2 and the light emitting diode LED and the other one of the source electrode and the drain electrode of the third transistor T3 is connected to the reference line RL. The third transistor T3 is turned on to transmit the reference voltage to the source electrode of the second transistor T2 to sense a threshold voltage of the second transistor T2. Accordingly, the third transistor T3 which senses a characteristic of the second transistor T2 can be referred to as a sensing transistor.

The storage capacitor Cst stores a potential difference between the gate electrode of the second transistor T2 and the source electrode of the second transistor T2 while the light emitting diode LED emits light, so that a constant current can be supplied to the light emitting diode LED. The storage capacitor Cst includes a plurality of capacitor electrodes. Some electrode of the storage capacitor Cst can be connected to the gate electrode of the second transistor T2 and the other electrode can be connected to the source electrode of the second transistor T2.

One or more light emitting diodes LED are disposed in each sub pixel SP. The plurality of light emitting diodes LED is elements which emit light by the current. The light emitting diode LED can include a light emitting diode LED which emits red light, green light, blue light, and the like and implement various color light including white by a combination thereof. Further, various color light can be implemented using the light emitting diode LED which emits specific color light and a light conversion member which converts light from the light emitting diode LED into another color light. The light emitting diode LED is connected between the second transistor T2 and the low potential power line VSS to be supplied with a driving current from the second transistor T2 to emit light.

In the meantime, the plurality of light emitting diodes LED disposed in one sub pixel SP can be connected in parallel. For example, one electrode of each of the plurality of light emitting diodes LED can be connected to the source electrode of the second transistor T2 and the other electrode can be connected to the same low potential power line VSS.

The touch unit TU is disposed in the display panel PN together with the plurality of sub pixels SP. The touch unit TU can be disposed to be adjacent to the plurality of sub pixels SP. As described above, the touch unit TU is configured in an in-cell type to be embedded in the display panel PN so that the plurality of sub pixels SP and the touch unit TU in the display panel PN can be disposed to be adjacent to each other. The touch unit TU includes a touch sensing transistor ST and a touch capacitor Cf.

The touch sensing transistor ST is turned on to transmit a voltage of the touch electrode TE to the touch sensing line Sen. The touch sensing transistor ST can be connected between the touch sensing line Sen and the touch electrode TE. The touch sensing transistor ST can be connected to a scan line SL different from those of the transistors T1 and T3 of the sub pixel SP to be independently turned on. The touch sensing transistor ST includes a gate electrode connected to the second scan line SL2, a source electrode connected to the touch sensing line Sen, and a drain electrode connected between the touch electrodes TE. The touch sensing transistor ST is turned on by the scan signal SCAN of the second scan line SL2 to transmit the touch driving signal to the touch electrode TE. The touch driver TD can sense a voltage changed due to the touch capacitor Cf formed between the touch electrode TE and an external input FNG by means of the touch sensing transistor ST and the touch sensing line Sen. Therefore, the touch driver TD can sense the touch input by detecting a capacitance variation, for example, a voltage variance of the touch electrode TE through the touch sensing line Sen and sense a touch coordinate based on the touch sensing line Sen and the second scan line SL2.

The touch capacitor Cf is a capacitor formed between the touch electrode TE and the external input FNG. A voltage between the touch electrode TE and the external input FNG changes according to the external input FNG can be stored in the touch capacitor Cf. The charge stored in the touch capacitor Cf can vary depending on the presence of the external input FNG or a distance between the external input FNG and the touch electrode TE and the touch driver TD detects the charge variation to sense the touch input and the touch coordinate.

In the meantime, even though in FIG. 2, it is illustrated that one touch unit TU is disposed to be adjacent to one sub pixel SP, one touch unit TU can be disposed to be adjacent to the plurality of sub pixels SP, but is not limited thereto.

Hereinafter, an example of the structure of the display panel PN of the display device 100 according to the exemplary embodiment of the present disclosure will be described in detail with reference to FIGS. 3 to 6.

Figure 3:
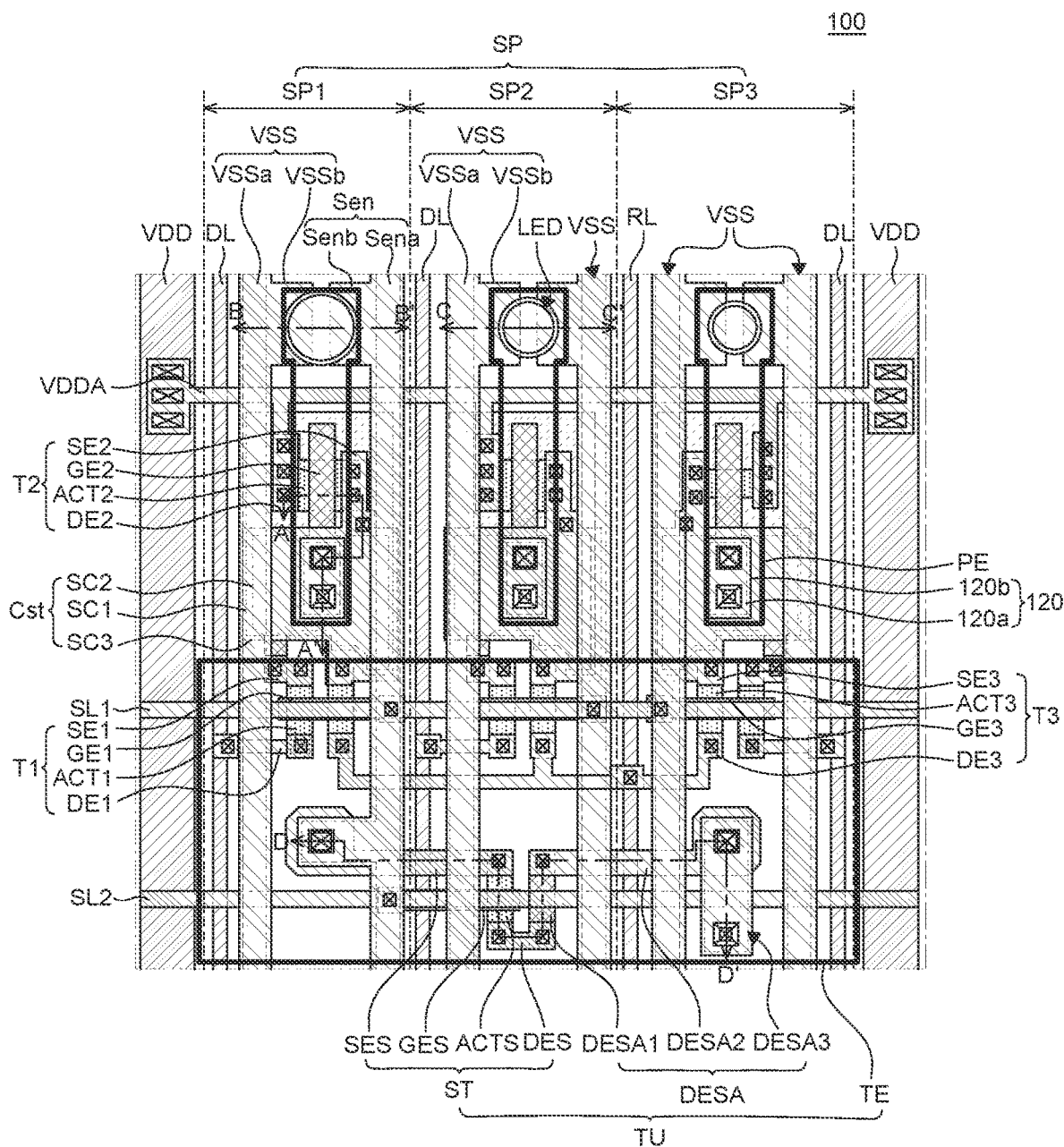
FIG. 3 is an enlarged plan view of a display panel of a display device according to an exemplary embodiment of the present disclosure.
Figure 4:
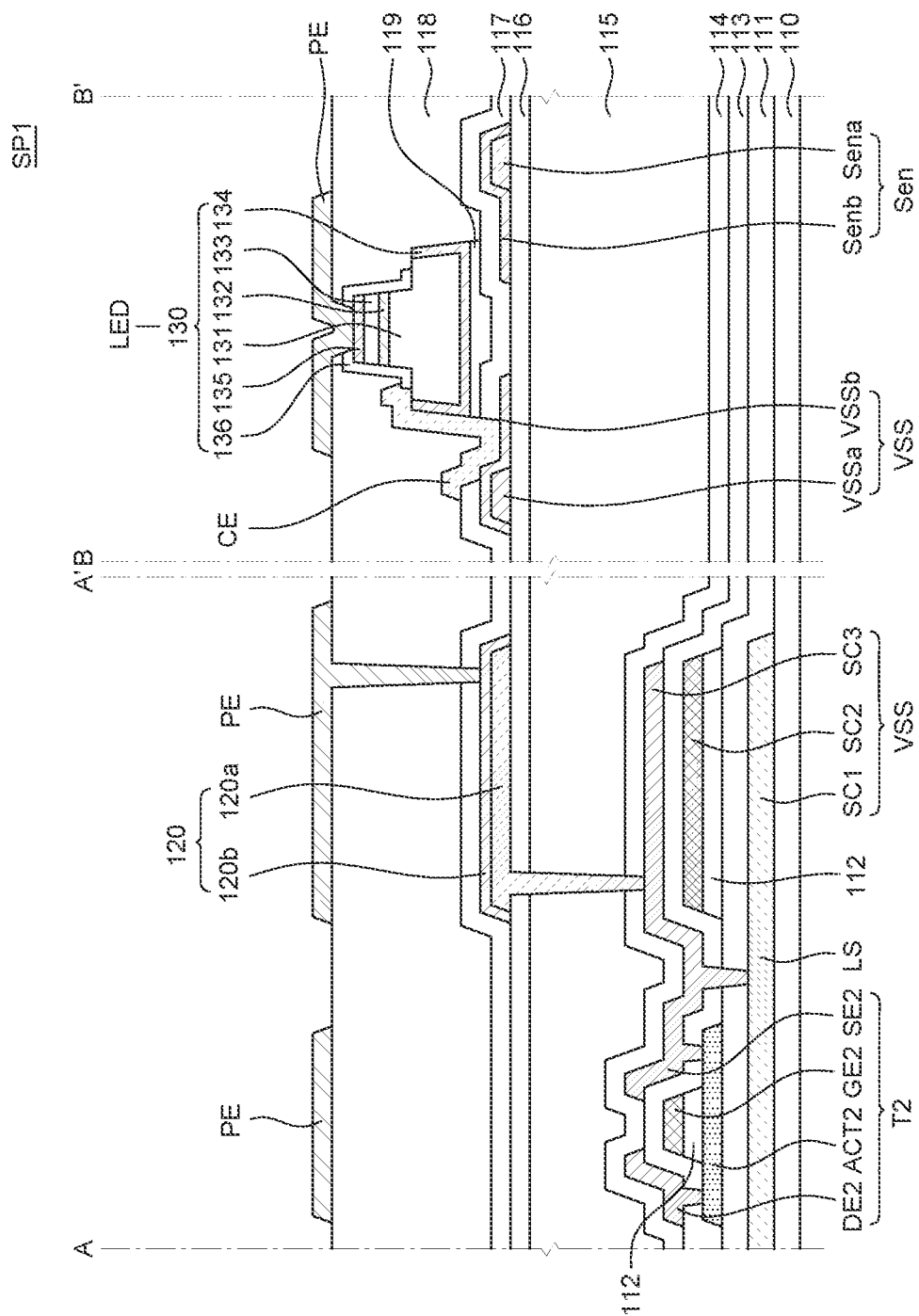
FIG. 4 is a cross-sectional view taken along the lines A-A' and B-B' of FIG. 3.
Figure 5:
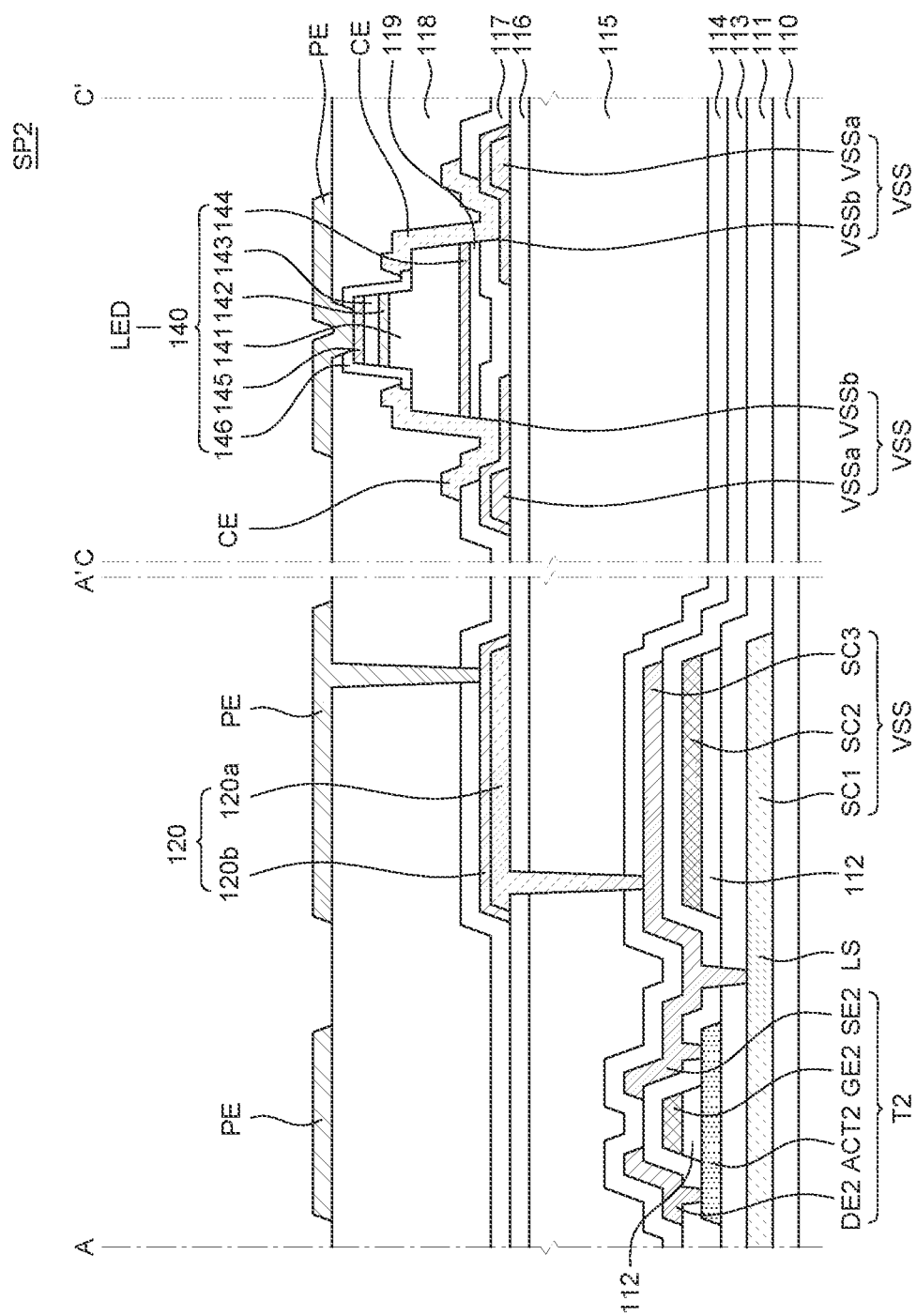
FIG. 5 is a cross-sectional view taken along the lines A-A' and C-C' of FIG. 3.
Figure 6:
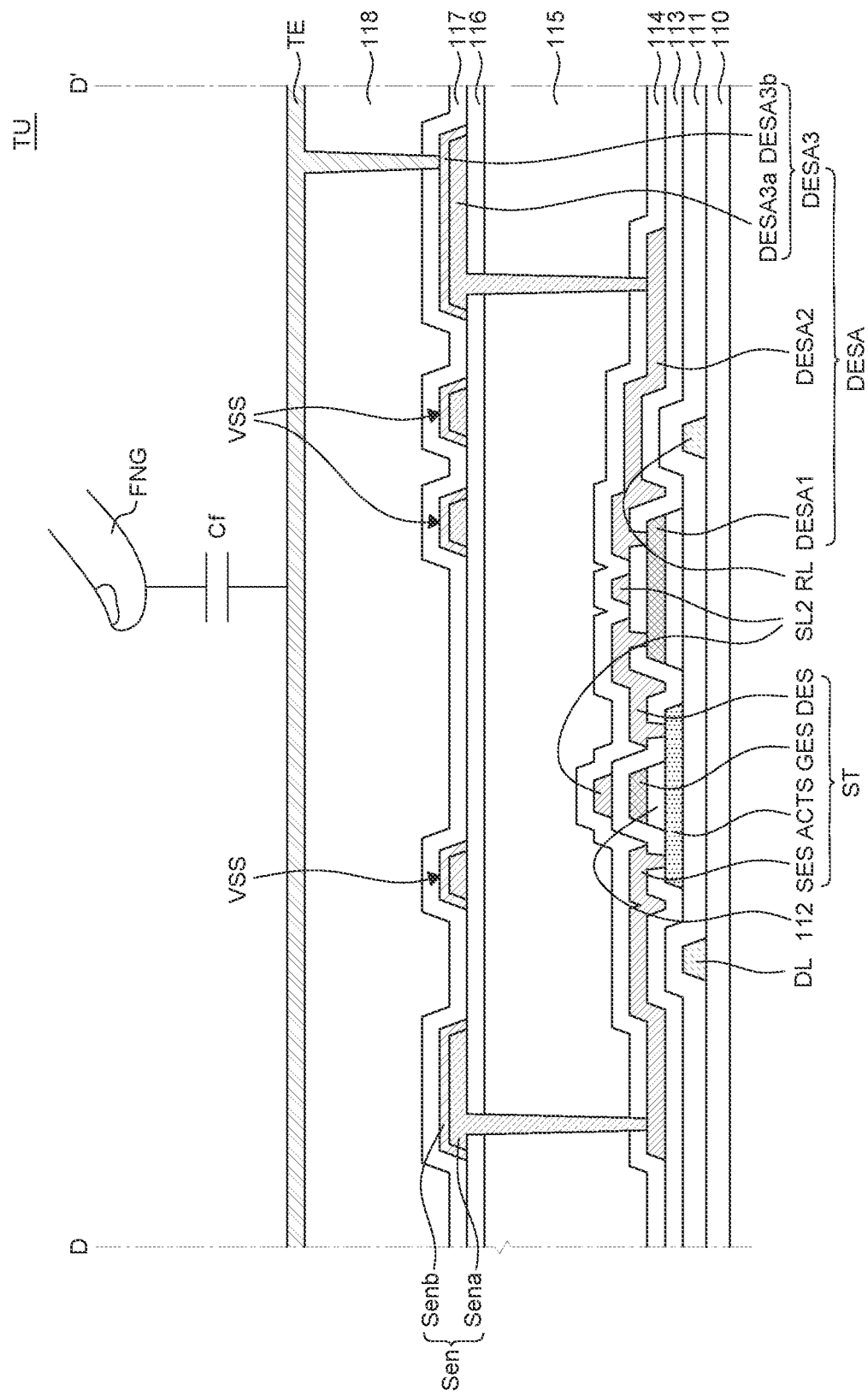
FIG. 6 is a cross-sectional view taken along the line D-D' of FIG. 3.

FIG. 3 is an enlarged plan view of a display panel of a display device according to an exemplary embodiment of the present disclosure. FIG. 4 is a cross-sectional view taken along the lines A-A' and B-B' of FIG. 3. FIG. 5 is a cross-sectional view taken along the lines A-A' and C-C' of FIG. 3. FIG. 6 is a cross-sectional view taken along the line D-D' of FIG. 3. Specifically, FIGS. 4 and 5 are cross-sectional views of a plurality of sub pixels SP. FIG. 6 is a cross-sectional view of a touch unit TU.

Referring to FIG. 3, the plurality of sub pixels SP is disposed in the display panel PN and the touch unit TU is disposed to be adjacent to the plurality of sub pixels SP. The plurality of sub pixels SP can be disposed to form a plurality of rows and a plurality of columns and a plurality of columns and the touch units TU can be also disposed to form a plurality of rows and a plurality of columns. The row in which the touch unit TU is disposed can be disposed between rows in which the plurality of sub pixels SP is disposed. For example, the plurality of sub pixels SP and the touch units TU can be alternately disposed in a column direction. One touch unit TU can have a width corresponding to one or more sub pixels SP. For example, in the column direction, one touch unit TU can be disposed in one area of a first sub pixel SP1, a second sub pixel SP2, and a third sub pixel SP3. One touch unit TU can have a width corresponding to three sub pixels SP. However, the design of the touch unit TU and the sub pixel SP illustrated in FIG. 3 are illustrative and the placement and the areas of the touch unit TU and the sub pixel SP can be designed in various forms, but the exemplary embodiment is not limited thereto.

Referring to FIGS. 3 to 5, the plurality of sub pixels SP includes a first sub pixel SP1, a second sub pixel SP2, and a third sub pixel SP3. Each of the first sub pixel SP1, the second sub pixel SP2, and the third sub pixel SP3 includes a light emitting diode LED and a circuit to independently emit light. For example, the first sub pixel SP1 can be a red sub pixel, the second sub pixel SP2 can be a green sub pixel, and the third sub pixel SP3 can be a blue sub pixel, but the exemplary embodiment is not limited thereto.

The display panel PN includes a substrate 110, a buffer layer 111, a gate insulating layer 112, an interlayer insulating layer 113, a first passivation layer 114, a first planarization layer 115, a second passivation layer 116, a third passivation layer 117, an adhesive layer 119, and a second planarization layer 118.

First, the substrate 110 is a component for supporting various components included in the display device 100 and can be formed of an insulating material. For example, the substrate 110 can be formed of glass, resin, or the like. Further, the substrate 110 can be configured to include polymer or plastics or can be formed of a material having flexibility.

A high potential power line VDD, a plurality of data lines DL, a reference line RL, a light shielding layer LS, and a first capacitor electrode SC1 are disposed on the substrate 110.

The high potential power line VDD is a wiring line which transmits a high potential power voltage to each of the plurality of sub pixels SP. The plurality of high potential power lines VDD can transmit the high potential power voltage to a second transistor T2 of each of the plurality of sub pixels SP. The high potential power line VDD can extend along a column direction between the plurality of sub pixels SP. For example, the high potential power line VDD can be disposed to extend along a column direction between the first sub pixel SP1 and the third sub pixel SP3. The high potential power line VDD can be electrically connected to the drain electrode of the second transistor T2 of each of the plurality of sub pixels SP disposed in the row direction by means of an auxiliary high potential power line VDDA to be described below.

The plurality of data lines DL is wiring lines which transmit the data voltage to each of the plurality of sub pixels SP. The plurality of data lines DL can be connected to the first transistor T1 of each of the plurality of sub pixels SP. The plurality of data lines DL can extend along a column direction between the plurality of sub pixels SP. For example, a data line DL extending in the column direction between the first sub pixel SP1 and the high potential power line VDD can transmit the data voltage to the first sub pixel SP1. A data line DL disposed between the first sub pixel SP1 and the second sub pixel SP2 can transmit the data voltage to the second sub pixel SP2. A data line DL disposed between the third sub pixel SP3 and the high potential power line VDD can transmit the data voltage to the third sub pixel SP3.

The reference line RL is a wiring line which transmits a reference voltage to the plurality of sub pixels SP. The reference line RL can be connected to the third transistor T3 of each of the plurality of sub pixels SP. The reference line RL can extend along a column direction between the plurality of sub pixels SP. For example, the reference line RL can be disposed to extend along a column direction between the second sub pixel SP2 and the third sub pixel SP3. A third drain electrode DE3 of the third transistor T3 of each of the first sub pixel SP1, the second sub pixel SP2, and the third sub pixel SP3 adjacent to the reference line RL extends in the row direction to be electrically connected to the reference line RL.

The light shielding layer LS is disposed in each of the plurality of sub pixels SP on the substrate 110. The light shielding layer LS blocks light which is incident to the transistor from the lower portion of the substrate 110 to minimize a leakage current. For example, the light shielding layer LS can block light incident to a second active layer ACT2 of the second transistor T2 which is a driving transistor.

In each of the plurality of sub pixels SP, a first capacitor electrode SC1 is disposed on the substrate 110. The first capacitor electrode SC1 can form a storage capacitor Cst together with the other capacitor electrode. The first capacitor electrode SC1 can be integrally formed with the light shielding layer LS.

A buffer layer 111 is disposed on the high potential power line VDD, the plurality of data lines DL, the reference line RL, the light shielding layer LS, and the first capacitor electrode SC1. The buffer layer 111 can reduce permeation of moisture or impurities through the substrate 110. The buffer layer 111 can be configured by a single layer or a double layer of silicon oxide SiOx or silicon nitride SiNx, but is not limited thereto. However, the buffer layer 111 can be omitted depending on a type of substrate 110 or a type of transistor, but is not limited thereto.

In each of the plurality of sub pixels SP, the first transistor T1, the second transistor T2, and the third transistor T3 are disposed on the buffer layer 111.

The first transistor T1 is disposed in each of the plurality of sub pixels SP. The first transistor T1 includes a first active layer ACT1, a first gate electrode GE1, a first source electrode SE1, and a first drain electrode DE1.

The first active layer ACT1 is disposed on the buffer layer 111. The first active layer ACT1 can be formed of a semiconductor material such as an oxide semiconductor, amorphous silicon, or polysilicon, but is not limited thereto.

The gate insulating layer 112 is disposed on the first active layer ACT1. The gate insulating layer 112 is an insulating layer which insulates the first active layer ACT1 from the first gate electrode GE1 and can be configured by a single layer or a double layer of silicon oxide (SiOx) or silicon nitride (SiNx), but is not limited thereto.

The first gate electrode GE1 is disposed on the gate insulating layer 112. The first gate electrode GE1 can be electrically connected to the first scan line SL1. The first gate electrode GE1 can be configured by a conductive material, such as copper (Cu), aluminum (Al), molybdenum (Mo), nickel (Ni), titanium (Ti), chrome (Cr), or an alloy thereof, but is not limited thereto.

The interlayer insulating layer 113 is disposed on the first gate electrode GE1. A contact hole is formed in the interlayer insulating layer 113 to allow the first source electrode SE1 and the first drain electrode DE1 to be connected to the first active layer ACT1, respectively. The interlayer insulating layer 113 is an insulating layer which protects components below the interlayer insulating layer 113 and can be configured by a single layer or a double layer of silicon oxide SiOx or silicon nitride SiNx, but is not limited thereto.

A first source electrode SE1 and a first drain electrode DE1 which are electrically connected to the first active layer ACT1 are disposed on the interlayer insulating layer 113. The first drain electrode DE1 can be connected to the data line DL and the first active layer ACT1 and the first source electrode SE1 can be connected to the first active layer ACT1 and the second gate electrode GE2 of the second transistor T2. The first source electrode SE1 and the first drain electrode DE1 can be configured by a conductive material, such as copper (Cu), aluminum (Al), molybdenum (Mo), nickel (Ni), titanium (Ti), chrome (Cr), or an alloy thereof, but are not limited thereto.

The second transistor T2 is disposed in each of the plurality of sub pixels SP. The second transistor T2 includes a second active layer ACT2, a second gate electrode GE2, a second source electrode SE2, and a second drain electrode DE2.

The second active layer ACT2 is disposed on the buffer layer 111. The second active layer ACT2 can be formed of a semiconductor material such as an oxide semiconductor, amorphous silicon, or polysilicon, but is not limited thereto.

The gate insulating layer 112 is disposed on the second active layer ACT2 and the second gate electrode GE2 is disposed on the gate insulating layer 112. The second gate electrode GE2 can be electrically connected to the first source electrode SE1 of the first transistor T1. The second gate electrode GE2 can be configured by a conductive material such as copper (Cu), aluminum (Al), molybdenum (Mo), nickel (Ni), titanium (Ti), chrome (Cr), or an alloy thereof, but is not limited thereto.

The interlayer insulating layer 113 is disposed on the second gate electrode GE2 and the second source electrode SE2 and the second drain electrode DE2 which are electrically connected to the second active layer ACT2 are disposed on the interlayer insulating layer 113. The second drain electrode DE2 can be electrically connected to the second active layer ACT2 and the high potential power line VDD and the second source electrode SE2 can be electrically connected to the second active layer ACT2 and the light emitting diode LED. The second source electrode SE2 and the second drain electrode DE2 can be configured by a conductive material, such as copper (Cu), aluminum (Al), molybdenum (Mo), nickel (Ni), titanium (Ti), chrome (Cr), or an alloy thereof, but are not limited thereto.

The third transistor T3 is disposed in each of the plurality of sub pixels SP. The third transistor T3 includes a third active layer ACT3, a third gate electrode GE3, a third source electrode SE3, and a third drain electrode DE3.

The third active layer ACT3 is disposed on the buffer layer 111. The third active layer ACT3 can be formed of a semiconductor material such as an oxide semiconductor, amorphous silicon, or polysilicon, but is not limited thereto.

The gate insulating layer 112 is disposed on the third active layer ACT3 and the third gate electrode GE3 is disposed on the gate insulating layer 112. The third gate electrode GE3 can be electrically connected to the first scan line SL1. The third gate electrode GE3 can be configured by a conductive material, such as copper (Cu), aluminum (Al), molybdenum (Mo), nickel (Ni), titanium (Ti), chrome (Cr), or an alloy thereof, but is not limited thereto.

The interlayer insulating layer 113 is disposed on the third gate electrode GE3 and the third source electrode SE3 and the third drain electrode DE3 which are electrically connected to the third active layer ACT3 are disposed on the interlayer insulating layer 113. The third drain electrode DE3 can be electrically connected to the third active layer ACT3 and the reference line RL and the third source electrode SE3 can be electrically connected to the third active layer ACT3 and the second source electrode SE2 of the second transistor T2. The third source electrode SE3 and the third drain electrode DE3 can be configured by a conductive material, such as copper (Cu), aluminum (Al), molybdenum (Mo), nickel (Ni), titanium (Ti), chrome (Cr), or an alloy thereof, but are not limited thereto.

The second capacitor electrode SC2 is disposed on the gate insulating layer 112. The second capacitor electrode SC2 is one of electrodes which form the storage capacitor Cst and can be disposed to overlap the first capacitor electrode SC1. The second capacitor electrode SC2 is integrally formed with the second gate electrode GE2 of the second transistor T2 to be electrically connected to the second gate electrode GE2. The first capacitor electrode SC1 and the second capacitor electrode SC2 are disposed to be spaced apart from each other with the buffer layer 111 and the gate insulating layer 112 therebetween.

Next, the plurality of scan lines SL including a first scan line SL1 and a second scan line SL2, an auxiliary high potential power line VDDA, and a third capacitor electrode SC3 are disposed on the interlayer insulating layer 113.

The first scan line SL1 and the second scan line SL2 are wiring lines which transmit a scan signal SCAN to each of the plurality of sub pixels SP. The first scan line SL1 can extend in the row direction while traversing the plurality of sub pixels SP. The second scan line SL2 can extend in the row direction while traversing the touch unit TU. The first scan line SL1 can be electrically connected to the first gate electrode GE1 of the first transistor T1 and the third gate electrode GE3 of the third transistor T3 of each of the plurality of sub pixels SP. The second scan line SL2 can be electrically connected to a sensing gate electrode GES of a touch sensing transistor ST of the touch unit TU.

An auxiliary high potential power line VDDA is disposed on the interlayer insulating layer 113. The auxiliary high potential power line VDDA can be disposed to extend in the row direction to traverse the plurality of sub pixels SP. The auxiliary high potential power line VDDA can electrically connect the high potential power line VDD extending in the column direction and the second drain electrode DE2 of the second transistor T2 of each of the plurality of sub pixels SP disposed along the row direction.

The third capacitor electrode SC3 is disposed on the interlayer insulating layer 113. The third capacitor electrode SC3 is an electrode which forms the storage capacitor Cst and can be disposed to overlap the first capacitor electrode SC1 and the second capacitor SC2. The third capacitor electrode SC3 is integrally formed with the second source electrode SE2 of the second transistor T2 to be electrically connected to the second source electrode SE2. The second source electrode SE2 can be electrically connected to the first capacitor electrode SC1 through a contact hole formed in the interlayer insulating layer 113 and the buffer layer 111. Therefore, the first capacitor electrode SC1 and the third capacitor electrode SC3 can be electrically connected to the second source electrode SE2 of the second transistor T2.

Accordingly, the storage capacitor Cst includes the first capacitor electrode SC1, the second capacitor electrode SC2, and the third capacitor electrode SC3 to store a voltage between the second gate electrode GE2 and the second source electrode SE2 of the second transistor T2. The first capacitor electrode ST1 is formed on the substrate 110 and is electrically connected to the second source electrode SE2 and the second capacitor electrode ST2 is formed on the buffer layer 111 and the gate insulating layer 112 and is connected to the second gate electrode GE2. The third capacitor electrode ST3 is formed on the interlayer insulating layer 113 and is connected to the second source electrode SE2.

The first passivation layer 114 is disposed on the first transistor T1, the second transistor T2, the third transistor T3, and the storage capacitor Cst. The first passivation layer 114 is an insulating layer which protects components below the first passivation layer 114 and can be configured by a single layer or a double layer of silicon oxide SiOx or silicon nitride SiNx, but is not limited thereto.

The first planarization layer 115 is disposed on the first passivation layer 114. The first planarization layer 115 can planarize an upper portion of the substrate 110 on which the plurality of transistors T1, T2, T3, and ST and the storage capacitor Cst are disposed. The first planarization layer 115 can be configured by a single layer or a double layer, and for example, can be formed of photoresist or an acrylic organic material, but is not limited thereto.

The second passivation layer 116 is disposed on the first planarization layer 115. The second passivation layer 116 is an insulating layer which protects components below the second passivation layer 116 and can be configured by a single layer or a double layer of silicon oxide SiOx or silicon nitride SiNx, but is not limited thereto.

The connection electrode 120, the plurality of low potential power lines VSS, and the touch sensing line Sen are disposed on the second passivation layer 116.

First, the connection electrode 120 is disposed in each of the plurality of sub pixels SP. The connection electrode 120 is an electrode which electrically connects the second transistor T2 and the pixel electrode PE. The connection electrode 120 can be electrically connected to the second source electrode SE2 which also serves as the third capacitor electrode SC3 through a contact hole formed in the second passivation layer 116, the first planarization layer 115, and the first passivation layer 114.

The connection electrode 120 can have a double-layered structure formed by a first connection layer 120a and a second connection layer 120b. The first connection layer 120a is disposed on the second passivation layer 116 and the second connection layer 120b which covers the first connection layer 120a is disposed. The second connection layer 120b can be disposed to enclose all a top surface and side surfaces of the first connection layer 120a. The second connection layer 120b is formed of a material which is more resistant to corrosion than the first connection layer 120a so that when the display device 100 is manufactured, the short defect due to the migration between the first connection layer 120a and the adjacent wiring line can be minimized. For example, the first connection layer 120a can be formed of a conductive material, such as copper (Cu) or chrome (Cr) and the second connection layer 120b can be formed of molybdenum (Mo), titanium molybdenum (MoTi), or the like, but are not limited thereto.

A plurality of low potential power lines VSS is disposed on the second passivation layer 116. The plurality of low potential power lines VSS is wiring lines which transmit a low potential power voltage to the light emitting diode LED. The plurality of low potential power lines VSS can extend in the column direction in each of the plurality of sub pixels SP. For example, in the first sub pixel SP1, one low potential power line VSS is disposed and in the second sub pixel SP2 and the third sub pixel SP3, one pair of low potential power lines VSS which are spaced apart from each other with a constant interval therebetween can be disposed.

Each of the plurality of low potential power lines VSS includes a first conductive layer VSSa and a first clad layer VSSb. The first conductive layer VSSa is disposed on the second passivation layer 116 and the first clad layer VSSb which covers all the top surface and the side surfaces of the first conductive layer VSSa is disposed on the first conductive layer VSSa. For example, the first conductive layer VSSa can be formed of a conductive material, such as copper (Cu) and chrome (Cr). The first clad layer VSSb can be formed of a material which is more resistant to corrosion than the first conductive layer VSSa, for example, molybdenum (Mo), titanium molybdenum (MoTi), or the like, but is not limited thereto.

The touch sensing line Sen is disposed on the second passivation layer 116. The touch sensing line Sen is a wiring line which is connected to the touch sensing transistor ST to transmit a touch driving signal and detects a capacitance variation of the touch capacitor Cf. The touch sensing line Sen can extend in the column direction in any one of the plurality of sub pixels SP. For example, the touch sensing line Sen can extend in the column direction with a predetermined interval from the low potential power line VSS in the first sub pixel SP1.

The touch sensing line Sen includes a second conductive layer Sena and a second clad layer Senb. The second conductive layer Sena is disposed on the second passivation layer 116 and the second clad layer Senb which covers all the top surface and the side surfaces of the second conductive layer Sena is disposed on the second conductive layer Sena. For example, the second conductive layer Sena can be formed of a conductive material, such as copper (Cu) and chrome (Cr). The second clad layer Senb can be formed of a material which is more resistant to corrosion than the second conductive layer Sena, for example, molybdenum (Mo), titanium molybdenum (MoTi), or the like, but is not limited thereto.

The third passivation layer 117 is disposed on the connection electrode 120, the low potential power line VSS, and the touch sensing line Sen. The third passivation layer 117 is an insulating layer which protects components below the third passivation layer 117 and can be configured by a single layer or a double layer of silicon oxide SiOx or silicon nitride SiNx, but is not limited thereto.

Next, the light emitting diode LED is disposed on the third passivation layer 117. The light emitting element LED includes a first light emitting diode 130 and a second light emitting diode 140. For example, the first light emitting diode 130 can be disposed in the first sub pixel SP, among the plurality of sub pixels SP and the second light emitting diode 140 can be disposed in the second sub pixel SP2 and the third sub pixel SP3, among the plurality of sub pixels SP. However, the type of the light emitting diode LED is illustrative and only any one of the first light emitting diode 130 or the second light emitting diode 140 is used as the light emitting diode LED or another type of light emitting diode LED can be used, but is not limited thereto. Further, even though in FIGS. 4 and 5, for the convenience of description, it is illustrated that one light emitting diode LED is disposed in each of the plurality of sub pixels SP, a plurality of light emitting diodes LED can be disposed in each of the plurality of sub pixels SP, but is not limited thereto.

Referring to FIG. 4, the first light emitting diode 130, among the plurality of light emitting diodes LED, includes a first semiconductor layer 131, an emission layer 132, a second semiconductor layer 133, a first electrode 134, a second electrode 135, and an encapsulation layer 136.

The first semiconductor layer 131 is disposed on the third passivation layer 117 and the second semiconductor layer 133 is disposed on the first semiconductor layer 131. The first semiconductor layer 131 and the second semiconductor layer 133 can be layers formed by doping n-type and p-type impurities into a specific material. For example, the first semiconductor layer 131 and the second semiconductor layer 133 can be layers formed by doping p type and n type impurities into a material, such as gallium nitride (GaN), indium aluminum phosphide (InAlP), or gallium arsenide (GaAs). The p-type impurity material used here can be one of magnesium (Mg), zinc (Zn), beryllium (Be), and the like, and the n-type impurity material used here can be one of silicon (Si), germanium (Ge), tin (Sn), and the like, but are not limited thereto.

A part of the first semiconductor layer 131 can be disposed to outwardly protrude from the second semiconductor layer 133. A top surface of the first semiconductor layer 131 can be formed by a part overlapping a bottom surface of the second semiconductor layer 133 and a part disposed at an outside of the bottom surface of the second semiconductor layer 133. However, sizes and shapes of the first semiconductor layer 131 and the second semiconductor layer 133 can be modified in various forms, but are not limited thereto.

The emission layer 132 is disposed between the first semiconductor layer 131 and the second semiconductor layer 133. The emission layer 132 is supplied with holes and electrons from the first semiconductor layer 131 and the second semiconductor layer 133 to emit light. The emission layer 132 can be formed by a single layer or a multi-quantum well (MQW) structure, and for example, can be formed of indium gallium nitride (InGaN), gallium nitride (GaN), or the like, but is not limited thereto.

The first electrode 134 which encloses a bottom surface and side surfaces of the first semiconductor layer 131 is disposed. The first electrode 134 is an electrode which electrically connects the first light emitting diode 130 and the low potential power line VSS. The first electrode 134 can be configured by a conductive material, for example, a transparent conductive material, such as indium tin oxide (ITO) or indium zinc oxide (IZO) or an opaque conductive material, such as titanium (Ti), gold (Au), silver (Ag), copper (Cu) or an alloy thereof, but is not limited thereto.

The second electrode 135 is disposed on the top surface of the second semiconductor layer 133. The second electrode 135 is an electrode which electrically connects a pixel electrode PE to be described below and the second semiconductor layer 133. The second electrode 135 can be formed of a conductive material, for example, a transparent conductive material, such as indium tin oxide (ITO) or indium zinc oxide (IZO), but is not limited thereto.

The encapsulation layer 136 which encloses at least a part of the first semiconductor layer 131, the emission layer 132, the second semiconductor layer 133, the first electrode 134, and the second electrode 136 is disposed. The encapsulation layer 136 is formed of an insulating material to protect the first semiconductor layer 131, the emission layer 132, and the second semiconductor layer 133. The encapsulation layer 136 can be disposed so as to cover the emission layer 132, a part of a side surface of the first semiconductor layer 131 adjacent to the emission layer 132, and a part of a side surface of the second semiconductor layer 133 adjacent to the emission layer 132. The first electrode 134 and the second electrode 135 can be exposed from the encapsulation layer 136 and a contact electrode CE and a pixel electrode PE to be formed later and the first electrode 134 and the second electrode 135 can be electrically connected.

Referring to FIG. 5, the second light emitting diode 140 includes a first semiconductor layer 141, an emission layer 142, a second semiconductor layer 143, a first electrode 144, a second electrode 145, and an encapsulation layer 146. The first semiconductor layer 141, the emission layer 142, the second semiconductor layer 143, the second electrode 145, and the encapsulation layer 146 of the second light emitting diode 140 can be substantially the same as the first semiconductor layer 131, the emission layer 132, the second semiconductor layer 133, the second electrode 135, and the encapsulation layer 136 of the first light emitting diode 130. However, the only difference between the second light emitting diode 140 and the first light emitting diode 130 is a structure of the first electrode 144, but the other configuration is substantially the same.

The first electrode 144 of the second light emitting diode 140 is disposed to be in contact only with a bottom surface of the first semiconductor layer 141. As compared with the first light emitting diode 130 in which the first electrode 134 covers both the bottom surface and the side surface of the first semiconductor layer 131, in the second light emitting diode 140, the first electrode 144 is disposed only on the bottom surface of the first semiconductor layer 141. Therefore, the side surface of the first semiconductor layer 141 of the second light emitting diode 140 can be exposed from the first electrode 144. Therefore, the contact electrode CE is in contact with the side surface of the first semiconductor layer 141 and the side surface of the first electrode 144 to be electrically connected to the second light emitting diode 140.

In the meantime, the light emitting diode LED can be transferred onto the substrate 110 in various ways. For example, a plurality of assembly lines which forms an electric field is disposed on the substrate 110 to directly self-assemble the light emitting diode LED on the substrate 110. In this case, when the display device 100 is manufactured, in the first sub pixel SP1, the low potential power line VSS and the touch sensing line Sen which are spaced apart from each other with a predetermined interval therebetween can be used as assembly lines. In the second sub pixel SP2 and the third sub pixel SP3, one pair of low potential power lines VSS which are spaced apart from each other with a predetermined interval therebetween can be used as assembly lines.

Specifically, when the display device 100 is manufactured, in a state in which the low potential power line VSS and the touch sensing line Sen serving as a plurality of assembly lines and the third passivation layer 117 covering top portions thereof are formed, the light emitting diode LED can be self-assembled. The substrate 110 which forms up to the third passivation layer 117 and the light emitting diode LED are placed into a chamber in which a fluid is formed and an AC voltage is applied to the assembly line to form an electric field. The light emitting diode LED can be dielectrically polarized by the electric field to have a polarity. The dielectrically polarized light emitting diode LED can move to a predetermined position (i.e., in a predetermined position in each sub pixels) to be fixed by dielectrophoresis (DEP), for example, by the electric field formed by the AC voltage. Accordingly, the plurality of light emitting diodes LED can be fixed in an area between one pair of assembly lines using the dielectrophoresis. For example, in the first sub pixel SP1, the light emitting diode LED can be self-assembled in the area between the touch sensing line Sen and the low potential power line VSS. In the second sub pixel SP2 and the third sub pixel SP3, the light emitting diode LED can be self-assembled in the area between one pair of low potential power lines VSS. Accordingly, when the self-assembling method is used as described above, a process of precisely aligning the light emitting diodes LED is omitted to simply transfer the light emitting diode LED onto the substrate 110.

In the meantime, during the manufacturing process of the display device 100, in a state in which an organic layer having an opening is formed on the third passivation layer 117, the light emitting diode LED can be self-assembled. The opening of the organic layer can correspond to an area in which the light emitting diode LED should be self-assembled. Therefore, the light emitting diode LED can be self-assembled only in the opening of the organic layer, of the area between the plurality of low potential power lines VSS disposed along the column direction and the touch sensing line Sen. When the self-assembling of the light emitting diode LED is completed, the organic layer is removed and another configuration, such as the second planarization layer 118 and the pixel electrode PE, can be formed.

However, in the specification, even though it has been described that the touch sensing line Sen can be used as the assembly line together with the low potential power line VSS, a separate assembly line is disposed and the touch sensing line Sen can be disposed on the other layer. For example, instead of the touch sensing line Sen, a separate assembly line is disposed and the touch sensing line Sen can be disposed above any one of the substrate 110, the buffer layer 111, the gate insulating layer 112, the interlayer insulating layer 113, the first passivation layer 114, the first planarization layer 115, and the second passivation layer 116. For example, the touch sensing line Sen extends in the column direction on the gate insulating layer 112 and can be electrically connected to the touch sensing transistor ST of the plurality of touch units TU.

Further, the light emitting diode LED can be disposed on the substrate 110 by a transferring method using a temporary substrate in which a plurality of assembly lines is formed, other than the above-described self-assembling method. For example, after self-assembling the light emitting diode LED on the temporary substrate 110 in which the plurality of assembly lines is formed, the temporary substrate is located above the substrate 110 to transfer the light emitting diode LED which is self-assembled on the temporary substrate onto the substrate 110. A plurality of assembly lines which forms an electric field can be formed on the temporary substrate and the light emitting diode LED can be self-assembled on the temporary substrate by the electric field of the assembly line. In the state in which the temporary substrate is disposed so as to be opposite to the substrate 110, laser, and the like is irradiated onto the temporary substrate to transfer the light emitting diode LED onto the substrate 110 from the temporary substrate.

Next, referring to FIGS. 4 and 5, an adhesive layer 119 is disposed between the light emitting diode LED and the third passivation layer 117. The adhesive layer 119 can be an organic film which temporarily fixes the light emitting diode LED during the self-assembly process of the light emitting diode LED. When the display device 100 is manufactured, if an organic film which covers the light emitting diode LED is formed, a part of the organic film is filled in a space between the light emitting diode LED and the third passivation layer 117 to temporary fix the light emitting diode LED onto the third passivation layer 117. Thereafter, even though the organic film is removed, a part of the organic film which permeates under the light emitting diode LED remains without being removed to become an adhesive layer 119. The adhesive layer 119 can be formed of an organic material, for example, photoresist or an acrylic organic material, but is not limited thereto.

The contact electrode CE is disposed on the side surface of the light emitting diode LED. The contact electrode CE is an electrode for electrically connecting the light emitting diode LED and the low potential power line VSS. The contact electrode CE can be electrically connected to the low potential power line VSS through a contact hole formed in the third passivation layer 117. The contact electrode CE is disposed so as to enclose at least a part of side surfaces of the first semiconductor layers 131 and 141 and the first electrodes 134 and 144 of the light emitting diode LED to electrically connect the first semiconductor layers 131 and 141 and the first electrodes 134 and 144 and the low potential power line VSS.

At this time, referring to FIG. 4, no contact hole is formed in the third passivation layer 117 which covers the touch sensing line Sen so that the connection of the light emitting diode LED and the touch sensing line Sen can be suppressed.

In the meantime, in FIG. 4, it is illustrated that the contact electrode CE is formed on the contact hole of the third passivation layer 117 through which the low potential power line VSS is exposed and covers only a part of the first light emitting diode 130 adjacent to the contact hole. However, the contact electrode CE can be disposed to enclose all the lower side surfaces of the first light emitting diode 130, but it is not limited thereto.

Next, the second planarization layer 118 is disposed on the light emitting diode LED and the contact electrode CE. The second planarization layer 118 can planarize an upper portion of the substrate 110 in which the light emitting diode LED is disposed and fix the light emitting diode LED onto the substrate 110 together with the adhesive layer 119. The second planarization layer 118 can be configured by a single layer or a double layer, and for example, can be formed of photoresist or an acrylic organic material, but is not limited thereto.

The pixel electrode CE is disposed on the second planarization layer 118. The pixel electrode PE is an electrode which electrically connects the plurality of light emitting diodes LED and the connection electrode 120. The pixel electrode PE can be electrically connected to the light emitting diode LED, the connection electrode 120, and the second transistor T2 through the contact hole formed in the second planarization layer 118 and the third passivation layer 117. Accordingly, the second electrodes 135 and 145 of the light emitting diodes LED, the connection electrode 120, and the second source electrode SE2 of the second transistor T2 can be electrically connected to each other by means of the pixel electrode PE. The pixel electrode PE can be formed of a conductive material, for example, a transparent conductive material, such as indium tin oxide (ITO) or indium zinc oxide (IZO), but is not limited thereto.

Referring to FIGS. 3 and 6 together, the touch unit TU includes a touch sensing transistor ST, an auxiliary drain electrode DESA, a touch sensing line Sen, and a touch electrode TE.

The touch sensing transistor ST is disposed on the substrate 110 and the buffer layer 111. The touch sensing transistor ST includes a sensing active layer ACTS, a sensing gate electrode GES, a sensing source electrode SES, and a sensing drain electrode DES.

The sensing active layer ACTS is disposed on the buffer layer 111. The sensing active layer ACTS can be formed of a semiconductor material, such as an oxide semiconductor, amorphous silicon, or polysilicon, but is not limited thereto.

The gate insulating layer 112 is disposed on the sensing active layer ACTS and the sensing gate electrode GES is disposed on the gate insulating layer 112. The sensing gate electrode GES can be electrically connected to the second scan line SL2. The sensing gate electrode GES can be configured by a conductive material, such as copper (Cu), aluminum (Al), molybdenum (Mo), nickel (Ni), titanium (Ti), chrome (Cr), or an alloy thereof, but is not limited thereto.

The interlayer insulating layer 113 is disposed on the sensing gate electrode GES and the sensing source electrode SES and the sensing drain electrode DES which are electrically connected to the sensing active layer ACTS are disposed on the interlayer insulating layer 113. The sensing drain electrode DES can be electrically connected to the sensing active layer ACTS and the touch electrode TE and the sensing source electrode SES can be electrically connected to the sensing active layer ACTS and the touch sensing line Sen. The sensing source electrode SES and the sensing drain electrode DES can be configured by a conductive material, such as copper (Cu), aluminum (Al), molybdenum (Mo), nickel (Ni), titanium (Ti), chrome (Cr), or an alloy thereof, but are not limited thereto.

In the meantime, in order to electrically connect the sensing drain electrode DES and the touch electrode TE, an auxiliary drain electrode DESA can be further disposed. The auxiliary drain electrode DESA includes a first auxiliary drain electrode DESA1, a second auxiliary drain electrode DESA2, and a third auxiliary drain electrode DESA3.

The first auxiliary drain electrode DESA1 is disposed on the buffer layer 111 and the gate insulating layer 112. The first auxiliary drain electrode DESA1 can be electrically connected to the sensing drain electrode DES through a contact hole formed in the interlayer insulating layer 113.

The second auxiliary drain electrode DESA2 is disposed on the interlayer insulating layer 113. The second auxiliary drain electrode DESA2 can be electrically connected to the first auxiliary drain electrode DESA1 through a contact hole formed in the interlayer insulating layer 113.

The third auxiliary drain electrode DESA3 is disposed on the second passivation layer 116. The third auxiliary drain electrode DESA3 can be electrically connected to the second auxiliary drain electrode DESA2 through a contact hole formed in the second passivation layer 116, the first planarization layer 115, and the first passivation layer 114. The third auxiliary drain electrode DESA3 includes a first drain electrode layer DESA3a and a second drain electrode layer DESA3b. The first drain electrode layer DESA3a is disposed on the second passivation layer 116 and the second drain electrode layer DESA3b which covers the first drain electrode layer DESA3a is disposed on the first drain electrode layer DESA3a. For example, the first drain electrode layer DESA3a can be formed of a conductive material, such as copper (Cu) and chrome (Cr). The second drain electrode layer DESA3b can be formed of a material which is more resistant to corrosion than the first drain electrode layer DESA3a, for example, molybdenum (Mo), titanium molybdenum (MoTi), or the like, but is not limited thereto.

The touch sensing line Sen is disposed on the second passivation layer 116. The touch sensing line Sen can extend in the column direction in any one of the plurality of sub pixels SP. For example, the touch sensing line Sen can extend in the column direction with a predetermined interval from the low potential power line VSS in the first sub pixel SP1.

The touch sensing line Sen includes a second conductive layer Sena and a second clad layer Senb. The second conductive layer Sena is disposed on the second passivation layer 116. The second clad layer Senb which covers the top surface and the side surfaces of the second conductive layer Sena is disposed on the second conductive layer Sena. The second conductive layer Sena can be electrically connected to the sensing source electrode SES of the touch sensing transistor ST through a contact hole formed in the second passivation layer 116, the first planarization layer 115, and the first passivation layer 114. For example, the second conductive layer Sena can be formed of a conductive material, such as copper (Cu) and chrome (Cr). The second clad layer Senb can be formed of a material which is more resistant to corrosion than the second conductive layer Sena, for example, molybdenum (Mo), titanium molybdenum (MoTi), or the like, but is not limited thereto.

The touch electrode TE is disposed on the second planarization layer 118. The touch electrode TE can be electrically connected to the auxiliary drain electrode DESA through the contact hole formed in the second planarization layer 118 and the third passivation layer 117. Therefore, the touch electrode TE can be electrically connected to the touch sensing transistor ST through the auxiliary drain electrode DESA. The touch electrode TE can be disposed on the same layer with the same material as the pixel electrode PE. The touch electrode TE can be formed of a conductive material, for example, a transparent conductive material, such as indium tin oxide (ITO) or indium zinc oxide (IZO), but is not limited thereto.

When an external input FNG is detected in a place where the touch electrode TE is located, the external input FNG and the touch electrode TE can form a touch capacitor Cf and a capacitance of the touch electrode TE can be determined. Accordingly, the touch driver TD can detect the presence of the external input FNG and the coordinate based on the capacitance variance of the touch electrode TE of the touch unit TU.

In the meantime, the touch unit TU and the sub pixel SP are connected to different wiring lines to be driven so that the touch unit TU and the sub pixel SP can be independently driven. Therefore, during one frame period, the driving periods of the touch unit TU and the sub pixel SP are not separated, but the touch unit TU can be freely driven.

Hereinafter, a display period and a touch sensing period will be described with reference to FIGS. 7 and 8.

Figure 7:
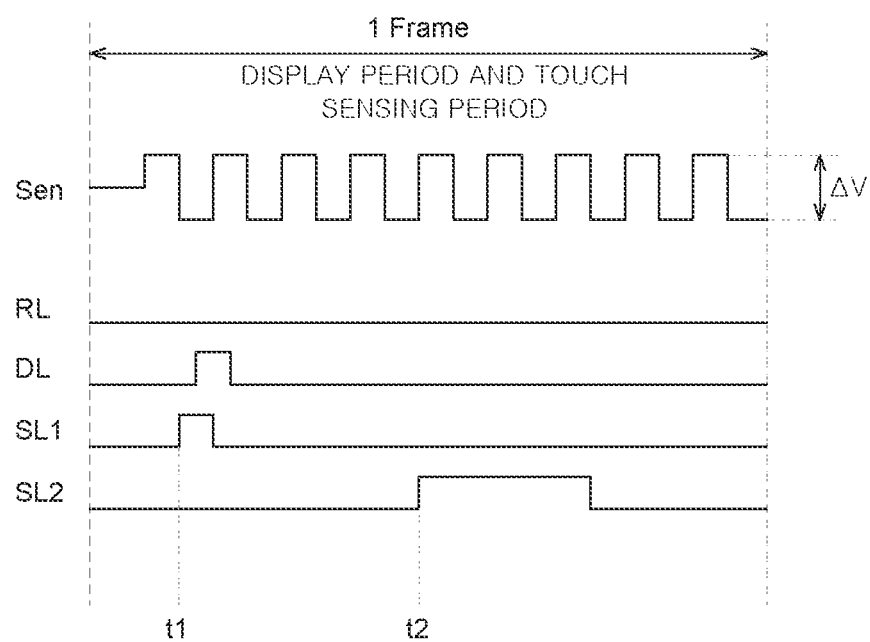
FIG. 7 is a timing chart illustrating an example of signals which are input to a sub pixel and a touch unit of a display device according to an exemplary embodiment of the present disclosure.

Particularly, FIG. 7 is a timing chart illustrating an example of signals which are input to a sub pixel and a touch unit of a display device according to an exemplary embodiment of the present disclosure. FIG. 8 is a graph illustrating an example of a voltage variance of a touch unit depending on presence of an external input in a display device according to an exemplary embodiment of the present disclosure.

Referring to FIG. 7, in the display device 100 according to the exemplary embodiment of the present disclosure, the plurality of sub pixels SP and the touch unit TU are driven by different wiring lines so that during one frame period, the sub pixel SP and the touch unit TU can be simultaneously driven. For example, the sub pixel SP is connected to the first scan line SL1, the data line DL, the reference line RL, the high potential power line VDD, and the low potential power line VSS. The touch unit TU is connected to the second scan line SL2 and the touch sensing line Sen. Accordingly, the sub pixel SP and the touch unit TU can be simultaneously driven. When the sub pixel SP is driven while a display period and a touch sensing period are not separately divided during one frame period, the touch unit TU can be freely driven.

During one frame period, at a first time t1, the scan signal SCAN is output to the first scan line SL1 to input the data voltage to the sub pixel SP. At the first time t1, the first transistor T1 is turned on by a high level of scan signal SCAN to transmit the data voltage to the second gate electrode GE2. Therefore, the second transistor T2 can supply a driving current to the light emitting diode LED based on the data voltage input to the second gate electrode GE2.

The touch driving signal can be continuously output to the touch sensing line Sen while driving the sub pixel SP. The touch driving signal output to the touch sensing line Sen during one frame period is supplied to the touch sensing transistor ST and the touch electrode TE to sense the external input FNG. For example, the touch driving signal of the touch sensing line Sen can be transmitted to the touch electrode TE through the touch sensing transistor ST which is turned on at a second time t2.

Figure 8:
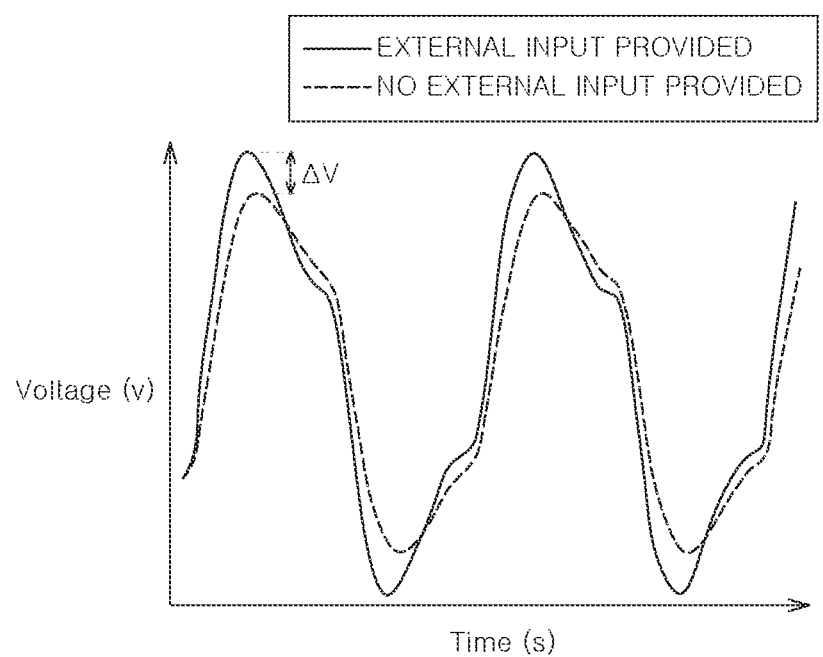
FIG. 8 is a graph illustrating an example of a voltage variance of a touch unit depending on presence of an external input in a display device according to an exemplary embodiment of the present disclosure.

Specifically, referring to FIG. 8, the external input FNG can be sensed based on the voltage variance of the touch electrode TE sensed by the touch sensing line Sen in the touch driver TD. The touch driving signal can be transmitted by the touch sensing transistor ST which is turned on at the second time t2 and the touch capacitor Cf can be formed between the external input FNG and the touch electrode TE. Further, the voltage variance of the touch electrode TE sensed by the touch driver TD through the touch sensing line Sen can vary according to the capacitance of the touch capacitor Cf. For example, as compared with the case in which the external input FNG is not provided, when the external input FNG is present, an amplitude of the voltage of the touch electrode TE can be increased. Therefore, the peak voltage can vary depending on the presence of the external input FNG and the external input FNG can be sensed based on the voltage variance ΔV of the peak voltage.

In the meantime, in the display panel PN, the touch units TU are disposed in a plurality of rows and the plurality of rows are divided into several groups and sequentially driven for every group to sense the touch. For example, in one period, touch units TU in first to n-th rows are simultaneously driven to sense the touch and in a subsequent period, touch units TU in n+1-th to 2n-th rows are simultaneously driven to sense the touch. Therefore, the touch units TU in the plurality of rows are simultaneously driven to improve a touch sensing sensitivity.

Accordingly, in the display device 100 according to the exemplary embodiment of the present disclosure, when the sub pixel SP is formed, the touch unit TU is formed together to provide a display device 100 which is capable of performing touch sensing. When the sub pixel SP is formed in the display panel PN, the configuration of the touch unit TU is formed together on the same layer as the configurations of the sub pixel SP to implement a touch unit TU. Specifically, at least some of the touch sensing transistors ST can be formed on the same layer with the same material as the first transistor T1, the second transistor T2, and the third transistor T3 of the sub pixel SP. When the low potential power line VSS is formed, the touch sensing line Sen can be formed on the same layer with the same material. The touch electrode TE can be disposed on the same layer with the same material as the pixel electrode PE. Accordingly, in the display device 100 according to the exemplary embodiment of the present disclosure, the touch unit TU can be formed in the display panel PN without an additional process so that the display device 100 which is capable of performing touch sensing can be easily implemented.

In the display device 100 according to the exemplary embodiment of the present disclosure, any one of assembly lines for self-assembling the light emitting diode LED is used as a touch sensing line Sen of the touch unit TU to implement the touch unit TU without adding a separate wiring line. The light emitting diode LED can be transferred onto the substrate 110 in various methods and among them, the self-assembling method using an assembly line is used to simply self-assemble and align the light emitting diode LED. The light emitting diode LED can be self-assembled in a specific position by an electric field formed in one pair of assembly lines and after completing the manufacturing of the display device 100, the assembly line is used as a low potential power line VSS to drive the display device 100. One of the pair of assembly lines disposed in every sub pixel SP is used as the low potential power line VSS and the other one is used as the touch sensing line Sen to drive both the sub pixel SP and the touch unit TU. Accordingly, in the display device 100 according to the exemplary embodiment of the present disclosure, the assembly line is used to easily form both the sub pixel SP and the touch unit TU.

In the display device 100 according to the exemplary embodiment of the present disclosure, the touch unit TU and the sub pixel SP can be independently driven. The touch unit TU is connected to the touch sensing line Sen and the second scan line SL2 to be driven and the sub pixel SP is connected to the first scan line SL1, the data line DL, the reference line RL, the low potential power line VSS, and the high potential power line VDD to be driven. For example, the touch sensing transistor ST and the touch capacitor Cf of the touch unit TU and the first transistor T1, the second transistor T2, the third transistor T3, the storage capacitor Cst, and the light emitting diode LED of the sub pixel SP are connected to different wiring lines to be driven. Therefore, the sub pixel SP and the touch unit TU can be independently driven and both the sub pixel SP and the touch unit TU can be simultaneously driven. For example, during one frame period, both the sub pixel SP and the touch unit TU are driven to display images and sense the touch, simultaneously. Accordingly, in the display device 100 according to the exemplary embodiment of the present disclosure, the touch unit TU and the sub pixel SP are connected to different lines to simultaneously drive the touch unit TU and the sub pixel SP.

Figure 9:
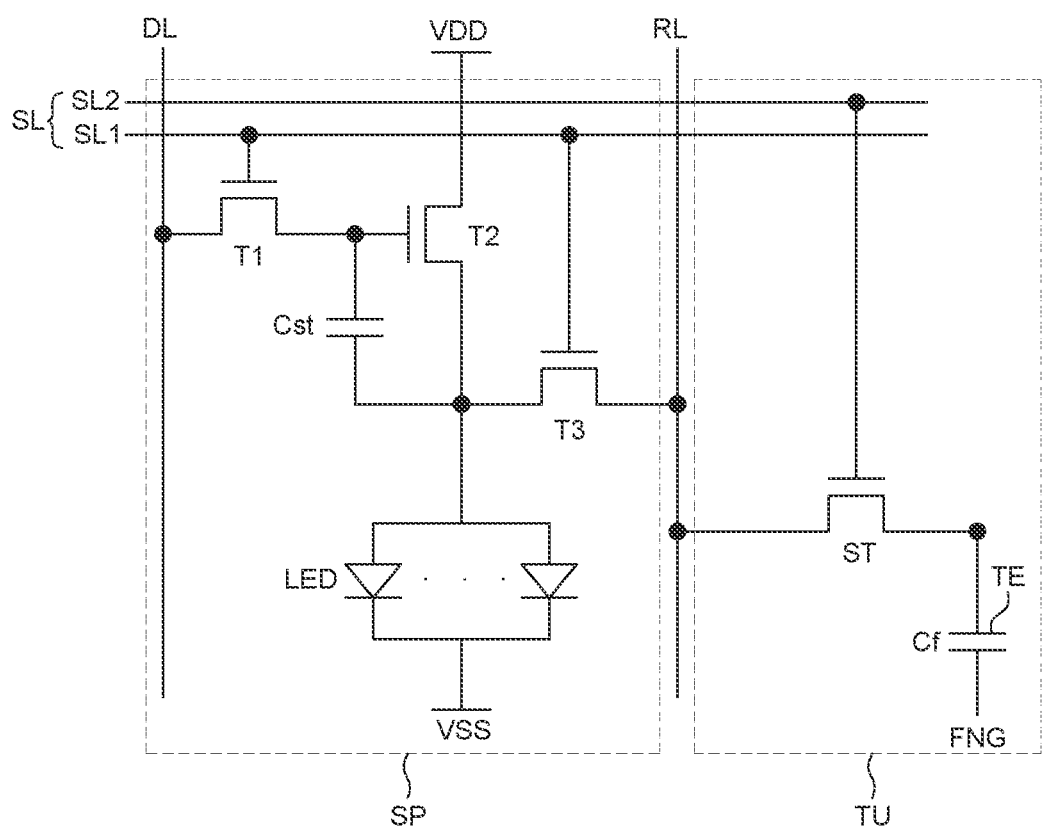
FIG. 9 is a circuit diagram of a sub pixel and a touch unit of a display device according to another exemplary embodiment of the present disclosure.
Figure 10:
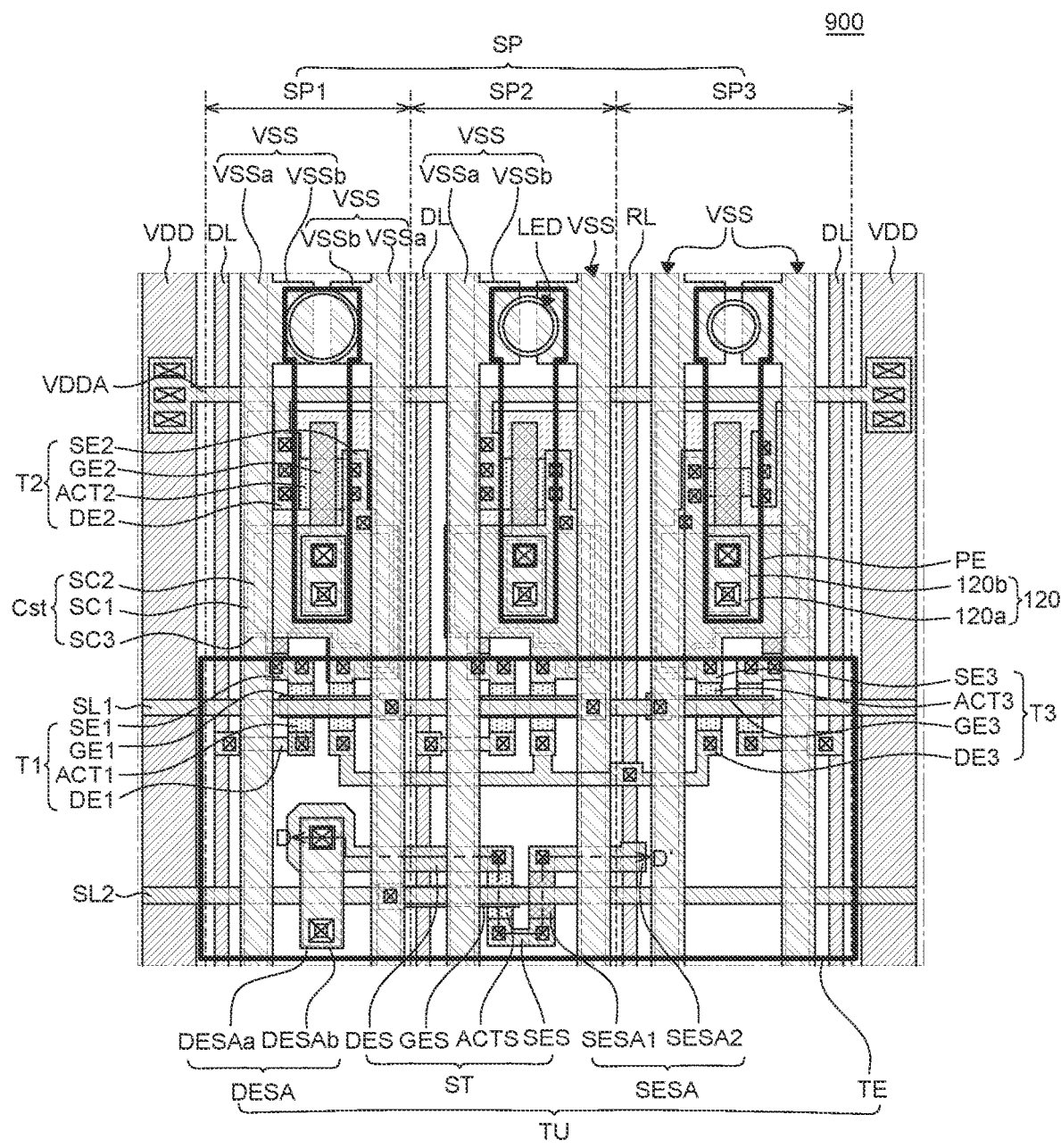
FIG. 10 is an enlarged plan view of a display panel of a display device according to another exemplary embodiment of the present disclosure.
Figure 11:
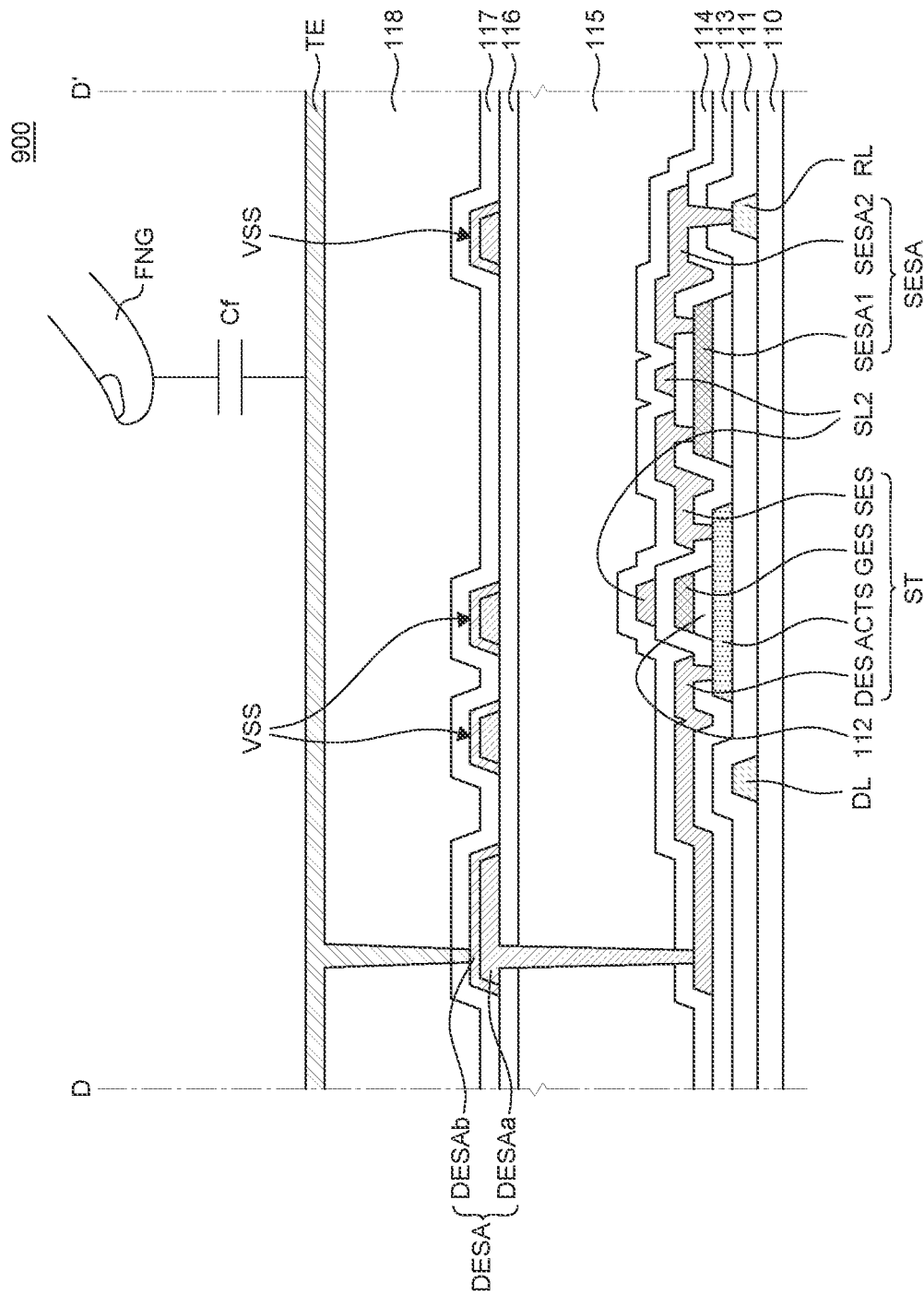
FIG. 11 is a cross-sectional view taken along the line D-D' of FIG. 10.
Figure 12:
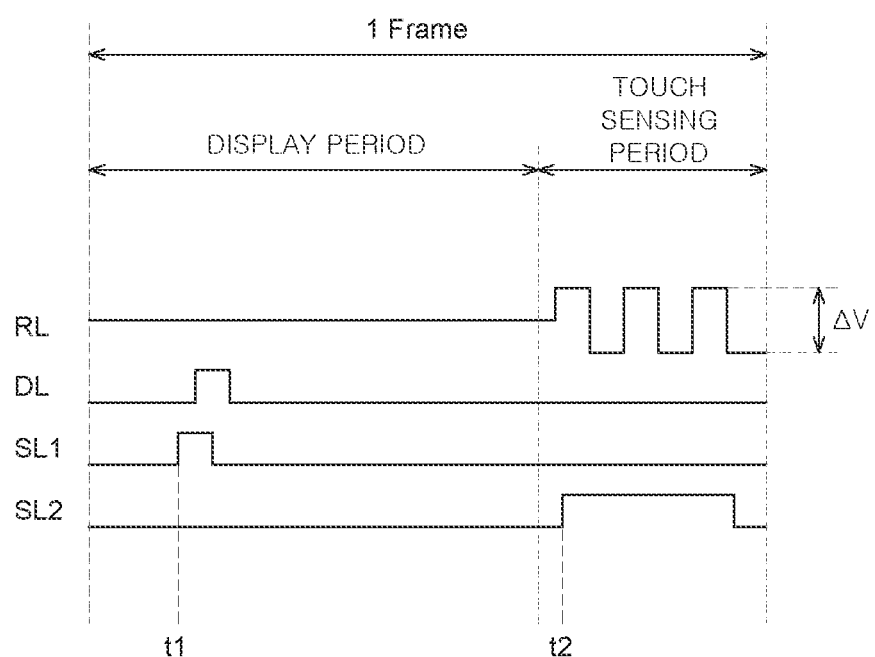
FIG. 12 is a timing chart illustrating an example of signals which are input to a sub pixel and a touch unit of a display device according to another exemplary embodiment of the present disclosure.

FIG. 9 is a circuit diagram of a sub pixel and a touch unit of a display device according to another exemplary embodiment of the present disclosure. FIG. 10 is an enlarged plan view of a display panel of a display device according to another exemplary embodiment of the present disclosure. FIG. 11 is a cross-sectional view taken along the line D-D' of FIG. 10. FIG. 12 is a timing chart illustrating an example of signals which are input to a sub pixel and a touch unit of a display device according to another exemplary embodiment of the present disclosure. A display device 900 of FIGS. 9 to 12 has the substantially same configuration as the display device 100 of FIGS. 1 to 8 except that the reference line RL is used instead of the touch sensing line Sen so that a redundant description will be omitted or may be briefly provided.

Referring to FIG. 9, a touch sensing transistor ST of the touch unit TU is connected to the reference line RL. A sensing source electrode SES and a sensing drain electrode DES of the touch sensing transistor ST can be connected between the reference line RL and the touch electrode TE. Accordingly, the reference line RL can be used while driving the sub pixel SP and the touch unit TU.

Referring to FIGS. 10 and 11 together, the reference line RL is disposed on the substrate 110 and the buffer layer 111 is disposed on the reference line RL. A sensing active layer ACTS of the touch sensing transistor ST is disposed on the buffer layer 111 and the gate insulating layer 112 and the sensing gate electrode GES are disposed on the sensing active layer ACTS and the buffer layer 111.

The interlayer insulating layer 113 is disposed on the sensing gate electrode GES and the sensing source electrode SES and sensing drain electrode DES of the touch sensing transistor ST and an auxiliary source electrode SESA and an auxiliary drain electrode DESA are disposed on the interlayer insulating layer 113.

The sensing source electrode SES can be electrically connected to the reference line RL through the auxiliary source electrode SESA. Specifically, the auxiliary source electrode SESA includes a first auxiliary source electrode SESA1 and a second auxiliary source electrode SESA2. The first auxiliary source electrode SESA1 is disposed between the gate insulating layer 112 and the interlayer insulating layer 113 and can be connected to the sensing source electrode SES through a contact hole formed in the interlayer insulating layer 113. The second auxiliary source electrode SESA2 is disposed on the interlayer insulating layer 113 to be electrically connected to the first auxiliary source electrode SESA1 below the interlayer insulating layer 113 and the reference line RL below the interlayer insulating layer 113 and the buffer layer 111. Accordingly, the sensing source electrode SES and the reference line RL can be electrically connected to each other through the auxiliary source electrode SESA.

The sensing drain electrode DES can be electrically connected to the touch electrode TE through the auxiliary drain electrode DESA. The auxiliary drain electrode DESA is disposed on the second passivation layer 116 and includes a first drain electrode layer DESAa and a second drain electrode layer DESAb. The first drain electrode layer DESAa is disposed on the second passivation layer 116 to be connected to the sensing drain electrode DES through a contact hole formed in the second passivation layer 116, the first planarization layer 115, and the first passivation layer 114. The second drain electrode layer DESAb is disposed to cover all the top surface and side surfaces of the first drain electrode layer DESAa to be connected to the touch electrode TE through the contact hole formed in the third passivation layer 117 and the second planarization layer 118. Accordingly, the sensing drain electrode DES and the touch electrode TE can be electrically connected to each other through the auxiliary drain electrode DESA.

In the meantime, the third transistor T3 of the sub pixel SP and the touch sensing transistor ST of the touch unit TU share one reference line RL to drive the sub pixel SP and the touch unit TU in different durations. For example, the display period in which the sub pixel SP is driven and the touch sensing period in which the touch unit TU is driven can be time-divisionally driven.

Specifically, referring to FIG. 12, in the display period, at the first time t1, a turn-on level of scan signal SCAN is applied to the first scan line SL1. The first transistor T1 is turned on by the scan signal SCAN of the first scan line SL1 and the data voltage is applied to the sub pixel SP to drive the sub pixel SP. At this time, during the display period in which the sub pixel SP is driven, the reference voltage is supplied to the reference line RL to normally drive the third transistor T3.

During the touch sensing period, at a second time t2, a turn-on level of scan signal SCAN is applied to the second scan line SL2. The touch sensing transistor ST is turned on by the scan signal SCAN of the second scan line SL2 and the touch driving signal is applied to the touch electrode TE to drive the touch unit TU. Therefore, during the touch sensing period in which the touch unit TU is driven, the touch driving signal is supplied to the reference line RL to normally drive the touch unit TU.

Accordingly, during the display period in which the third transistor T3 is turned on, the reference voltage can be applied to the reference line RL and during the touch sensing period in which the touch sensing transistor ST is turned on, the touch driving signal can be applied to the reference line RL.

In the display device 900 according to another exemplary embodiment of the present disclosure, the reference line RL of the sub pixel SP is used as the touch sensing line Sen to simplify the structure of the touch unit TU. In order to drive the touch unit TU, a touch sensing line Sen which applies the touch driving signal to the touch sensing transistor ST and the touch electrode TE and detects a capacitance variation of the touch electrode TE is necessary. However, in order to separately dispose the touch sensing line Sen, a design area is further necessary so that the aperture ratio can be degraded or the structure of the display device can become complex. However, in the display device 900 according to another exemplary embodiment of the present disclosure, the sub pixel SP and the touch unit TU are driven by sharing one reference line RL so that the touch sensing line Sen can be removed and the structure of the display device can be simplified.

Further, in the display device 900 according to another exemplary embodiment of the present disclosure, the display period and the touch sensing period are time-divisionally driven so that the sub pixel SP and the touch unit TU can share one reference line RL. During the display period, the third transistor T3 is turned on and the reference voltage is applied to the reference line RL to drive the sub pixel SP. Further, during the touch sensing period, the touch sensing transistor ST is turned on and the touch driving signal is applied to the reference line RL to drive the touch unit TU. Accordingly, in the display device 900 according to another exemplary embodiment of the present disclosure, even though the sub pixel SP and the touch unit TU share one reference line RL, the display period and the touch sensing period are driven in different durations so that the touch can be sensed while displaying images.

The exemplary embodiments of the present disclosure can also be described as follows:

According to an aspect of the present disclosure, there is provided a display device, which includes a plurality of sub pixels which is disposed on a substrate and each includes a driving transistor, a light emitting diode, and a pixel electrode connecting the driving transistor and the light emitting diode; and a plurality of touch units which is disposed on the substrate and each includes a touch sensing transistor and a touch electrode connected to the touch sensing transistor, where the pixel electrode and the touch electrode are disposed on the same layer.

The display device can further include a low potential power line disposed in each of the plurality of sub pixels; and a touch sensing line which is disposed in any one of the plurality of sub pixels to be connected to the touch sensing transistor, in a first sub pixel among the plurality of sub pixels, the touch sensing line and the low potential power line can be disposed to be spaced apart from each other with a predetermined interval therebetween and in a second sub pixel among the plurality of sub pixels, one pair of low potential power lines can be disposed to be spaced apart from each other with a predetermined interval therebetween.

In the first sub pixel, the light emitting diode can be disposed between the touch sensing line and the low potential power line and in the second sub pixel, the light emitting diode can be disposed between the one pair of low potential power lines.

The touch sensing line and the low potential power line can extend in one direction and the plurality of sub pixels and the plurality of touch units can be alternately disposed in the one direction.

The display device can further include one pair of low potential power lines which is disposed to be spaced apart from each other with a predetermined interval therebetween in each of the plurality of sub pixels, and a reference line disposed between the plurality of sub pixels, where the touch sensing transistor can be connected between the reference line and the touch electrode.

Each of the plurality of sub pixels can further include a sensing transistor in which any one of a source electrode and a drain electrode is connected to a node between the driving transistor and the light emitting diode and the other one of the source electrode and the drain electrode of the sensing transistor is connected to the reference line.

A touch driving signal can be applied to the reference line while the touch sensing transistor is turned on and a reference voltage can be applied to the reference line while the sensing transistor is turned on.

At least a part of the touch sensing transistor can be disposed on the same layer as the driving transistor.

According to another aspect of the present disclosure, there is provided a display device. The display device includes a display panel in which a plurality of sub pixels and a plurality of touch units are disposed, and a touch driver which supplies a touch driving signal to the plurality of touch units, the plurality of sub pixels and the plurality of touch units are disposed in different rows.

Each of the plurality of sub pixels can include a first transistor connected to a data line, a second transistor having a gate electrode connected to a source electrode of the first transistor, a third transistor connected between a source electrode of the second transistor and a reference line, and a light emitting diode connected to the source electrode of the second transistor.

Each of the plurality of touch units can include a touch electrode which forms a touch capacitor with an external input, and a touch sensing transistor connected to the touch electrode, and the touch sensing transistor can be connected to a scan line different from those of the first transistor and the third transistor.

The display device can further include a touch sensing line connected between the touch sensing transistor and the touch driver, and during one frame period, a display period in which the sub pixel is driven and a touch sensing period in which the touch unit is driven can at least partially overlap with each other.

The touch sensing transistor can be connected between the reference line and the touch electrode and during one frame period, where a display period in which the sub pixel is driven and a touch sensing period in which the touch unit is driven can be different periods.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure.

What is claimed is:

1. A display device, comprising:
   a plurality of sub pixels disposed on a substrate, each of the plurality of sub-pixels including a driving transistor, a light emitting diode, a pixel electrode connecting the driving transistor and the light emitting diode, and a connection electrode connecting the pixel electrode and the driving transistor;
   a plurality of touch units disposed on the substrate, each of the plurality of touch units including a touch sensing transistor and a touch electrode connected to the touch sensing transistor;
   a passivation layer disposed on the connection electrode and disposed below the light emitting diode;
   a planarization layer surrounding the light emitting diode and disposed on the passivation layer;
   a low potential power line disposed in each of the plurality of sub pixels; and
   a touch sensing line disposed in any one of the plurality of sub pixels to be connected to the touch sensing transistor,
   wherein the pixel electrode and the touch electrode are disposed on a same layer on the planarization layer,
   wherein in a first sub pixel among the plurality of sub pixels, the touch sensing line and the low potential power line are disposed to be spaced apart from each other with a predetermined interval therebetween, and
   in a second sub pixel among the plurality of sub pixels, one pair of low potential power lines are disposed to be spaced apart from each other with a predetermined interval therebetween.

2. The display device according to claim 1, wherein in the first sub pixel, the light emitting diode is disposed between the touch sensing line and the low potential power line, and in the second sub pixel, the light emitting diode is disposed between the one pair of low potential power lines.

3. The display device according to claim 1, wherein the touch sensing line and the low potential power line extend in one direction, and the plurality of sub pixels and the plurality of touch units are alternately disposed in the one direction.

4. The display device according to claim 1, further comprising:
   a reference line disposed between the plurality of sub pixels.

5. The display device according to claim 4, wherein each of the plurality of sub pixels further includes a sensing transistor having a source electrode and a drain electrode, and
   one of the source electrode and the drain electrode of the sensing transistor is connected to a node between the driving transistor and the light emitting diode, and the other one of the source electrode and the drain electrode of the sensing transistor is connected to the reference line.

6. The display device according to claim 1, wherein at least a part of the touch sensing transistor is disposed on a same layer as the driving transistor.

7. The display device according to claim 1,
   wherein the connection electrode and the touch sensing line are disposed on a same layer.

8. A display device, comprising:
   a display panel including a plurality of sub pixels and a plurality of touch units;
   a touch driver configured to supply a touch driving signal to the plurality of touch units; and
   a plurality of low potential power lines disposed in the plurality of sub pixels,
   wherein each of the plurality of sub pixels includes:
      a first transistor connected to a data line;
      a second transistor having a gate electrode connected to a source electrode of the first transistor;
      a third transistor connected between a source electrode of the second transistor and a reference line; and
      a light emitting diode connected to the source electrode of the second transistor, wherein each of the plurality of touch units includes:
      a touch electrode forming a touch capacitor with an external input; and
      a touch sensing transistor connected to the touch electrode,
   wherein the touch sensing transistor is connected to a scan line different from those of the first transistor and the third transistor,
   wherein the plurality of sub pixels and the plurality of touch units are disposed in different rows,
   wherein the plurality of low potential power lines extend in a column direction, and
   wherein the touch sensing transistor is connected between the reference line and the touch electrode and during one frame period, a display period in which one of the plurality of sub pixels is driven and a touch sensing period in which one of the plurality of touch units is driven are different periods.

9. The display device according to claim 8, wherein each of the plurality of touch units has a width corresponding one or more sub pixels.

10. The display device according to claim 8, wherein the plurality of sub pixels includes a first sub pixel, a second sub pixel, and a third sub pixel, and
    wherein each of the plurality of touch units has a width corresponding to the first sub pixel, the second sub pixel, and the third sub pixel.

* * * * *